United States Patent
Tanaka et al.

(10) Patent No.: US 7,216,311 B2
(45) Date of Patent: May 8, 2007

(54) SYSTEM AND METHOD FOR EVALUATING A SEMICONDUCTOR DEVICE PATTERN, METHOD FOR CONTROLLING PROCESS OF FORMING A SEMICONDUCTOR DEVICE PATTERN AND METHOD FOR MONITORING A SEMICONDUCTOR DEVICE MANUFACTURING PROCESS

(75) Inventors: Maki Tanaka, Yokohama (JP); Chie Shishido, Yokohama (JP); Ryo Nakagaki, Kawasaki (JP); Yuji Takagi, Kamakura (JP)

(73) Assignee: Hitachi High-Technologies Corporation, Tokyo (JP)

( * ) Notice: Subject to any disclaimer, the term of this patent is extended or adjusted under 35 U.S.C. 154(b) by 419 days.

(21) Appl. No.: 10/648,231

(22) Filed: Aug. 27, 2003

(65) Prior Publication Data
US 2004/0156223 A1    Aug. 12, 2004

(30) Foreign Application Priority Data
Feb. 12, 2003    (JP) .............................. 2003-033522

(51) Int. Cl.
*G06F 17/50* (2006.01)
*G06F 9/45* (2006.01)
*G01N 23/00* (2006.01)

(52) U.S. Cl. .............................. 716/4; 716/5; 250/311
(58) Field of Classification Search .................... 716/4, 716/5; 250/311
See application file for complete search history.

(56) References Cited

U.S. PATENT DOCUMENTS

| 5,900,633 | A  | * | 5/1999 | Solomon et al. | ........ 250/339.08 |
| 6,175,947 | B1 | * | 1/2001 | Ponnapalli et al. | ............ 716/5 |
| 2003/0015660 | A1 | * | 1/2003 | Shishido et al. | ............ 250/311 |

* cited by examiner

*Primary Examiner*—Vuthe Siek
*Assistant Examiner*—Magid Y Dimyan
(74) *Attorney, Agent, or Firm*—Antonelli, Terry, Stout & Kraus, LLP.

(57) ABSTRACT

In order to realize a means for acquiring three-dimensional shape information about patterns by nondestruction and evaluate a relationship between the three-dimensional shape information about these patterns and device properties, a semiconductor device pattern evaluating system is provided with a feature index calculating means for quantifying a property of a three-dimensional shape of a pattern to be evaluated, as feature index, a database that records therein a relationship between the feature index of each three-dimensional pattern shape and a device property of a circuit containing patterns each having the feature index, and a device property estimating means for estimating a property of a device circuit formed by the pattern to be evaluated, on the basis of the feature index of the three-dimensional pattern shape, which have been quantified by the feature index calculating means, and the information recorded in the database.

16 Claims, 18 Drawing Sheets

NORMAL

RETROGRADE

TAPERED

SIDEWALL TILT ANGLE θ

FOOTING

Poly Si

SiO2 (GATE OXIDE FILM)

Si Substrate

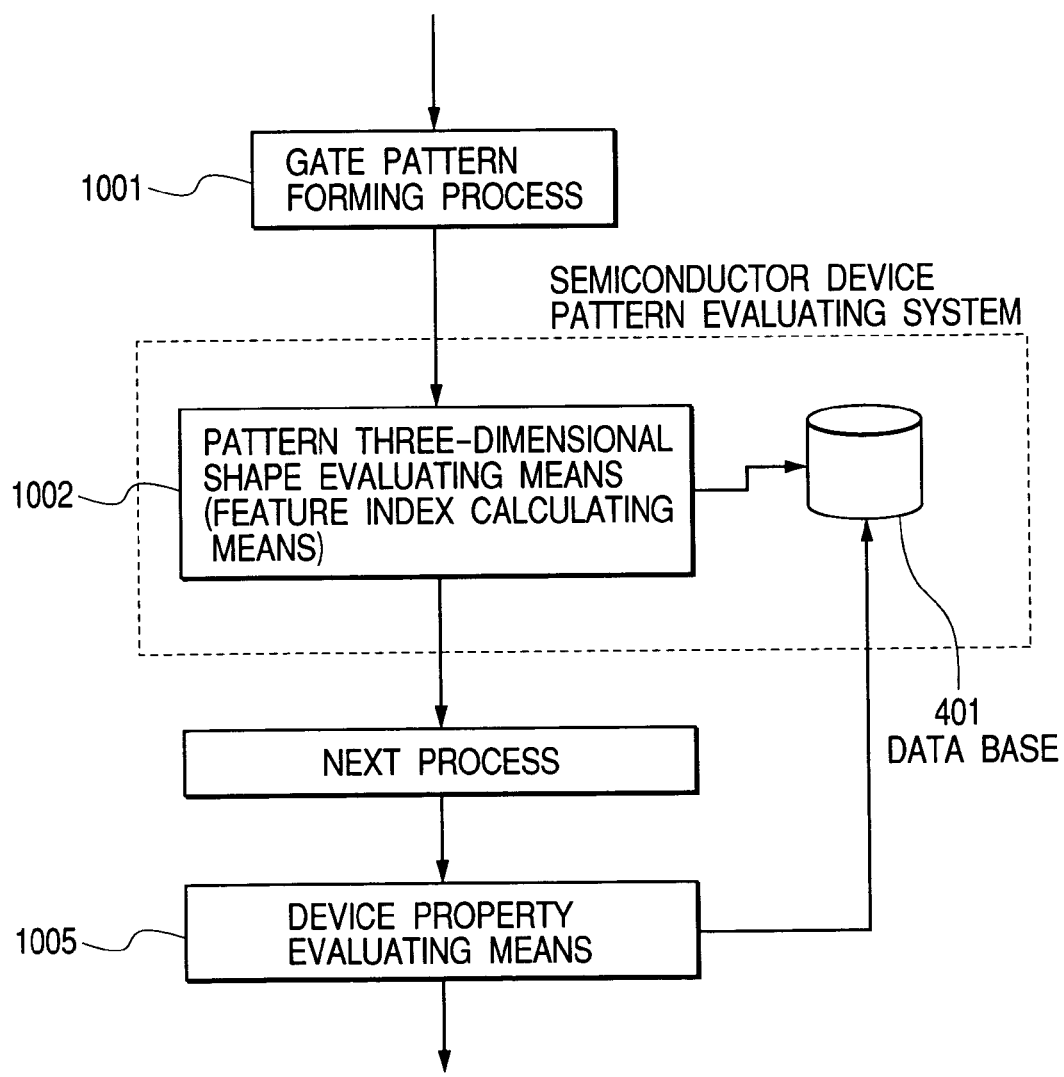

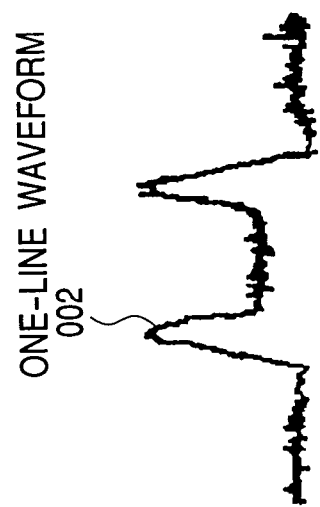
FIG. 6(a)
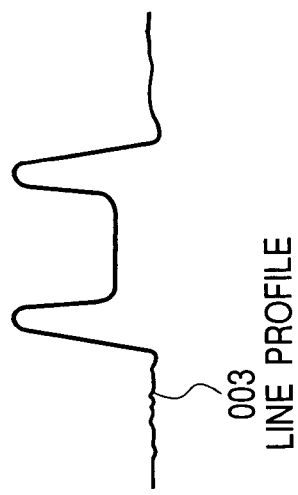
FIG. 6(b)
ONE-LINE WAVEFORM
002
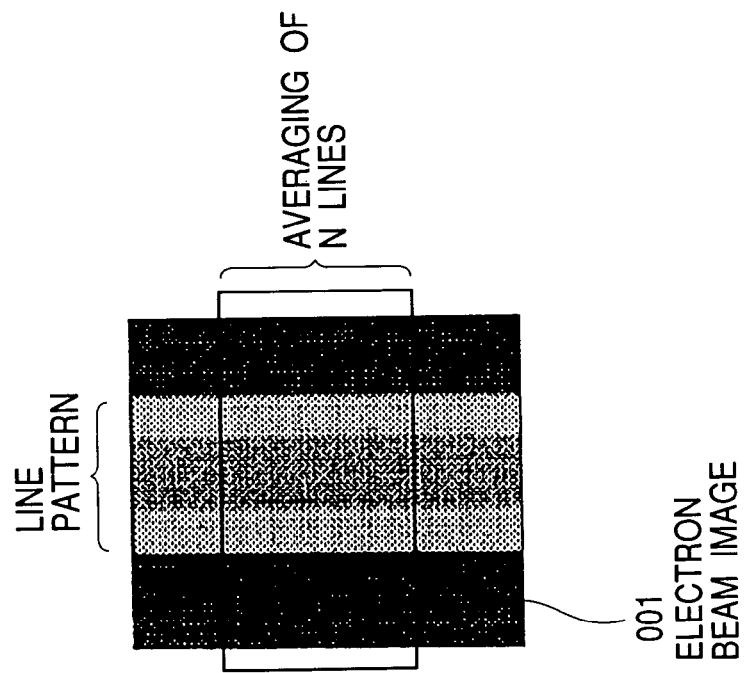
FIG. 6(c)
003
LINE PROFILE

TAPERED

FOOTING

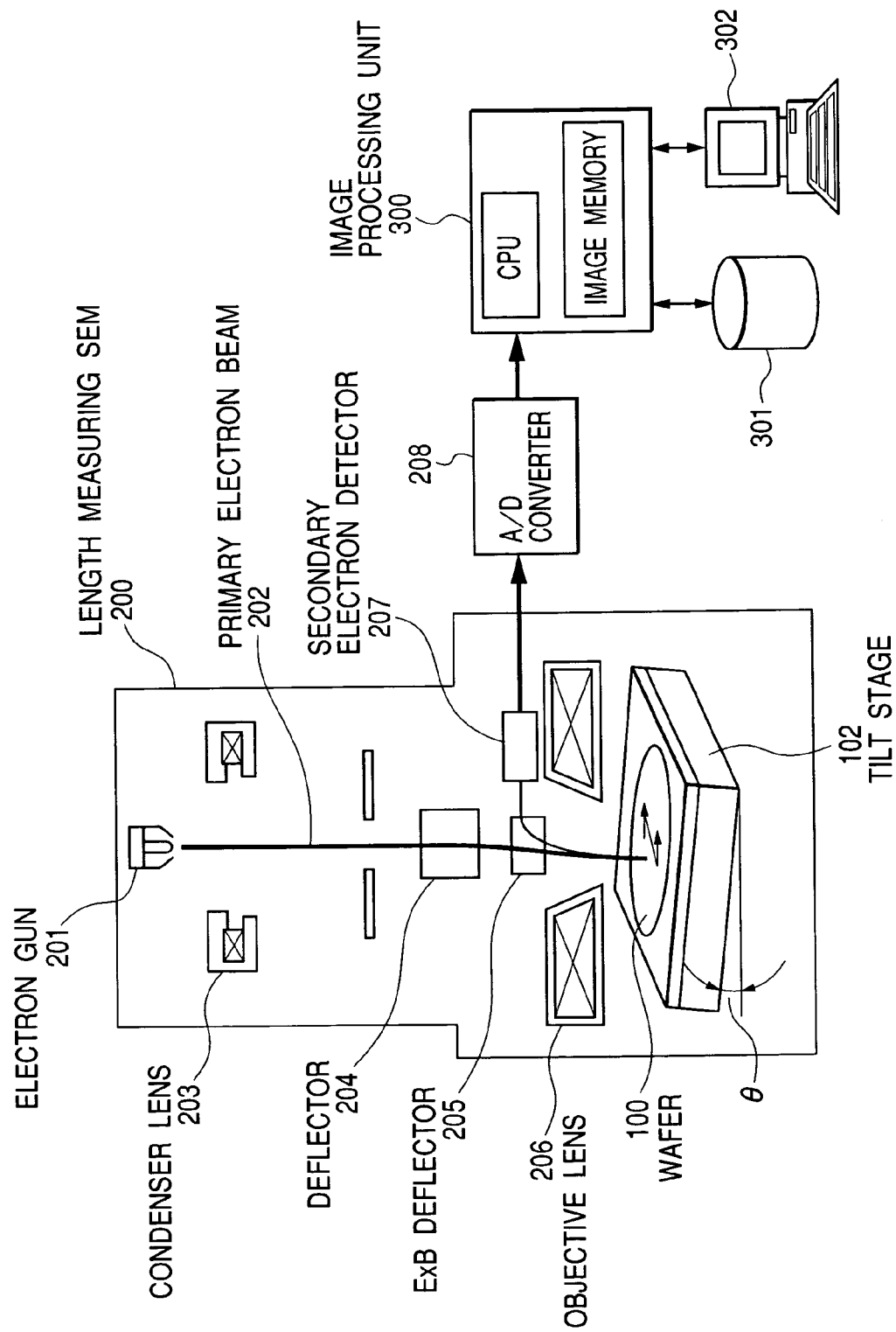

FIG. 14(a)                FIG. 14(b)
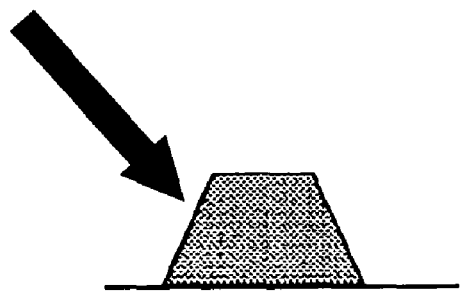
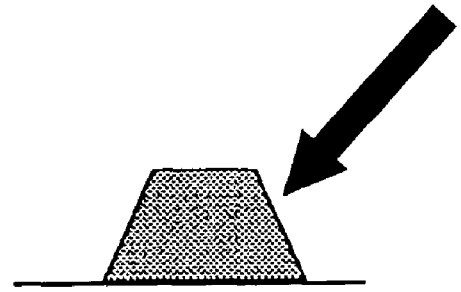
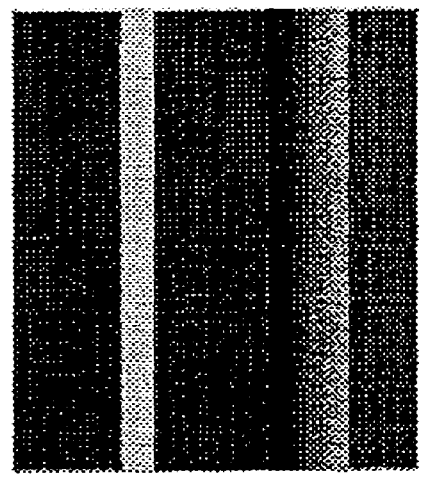
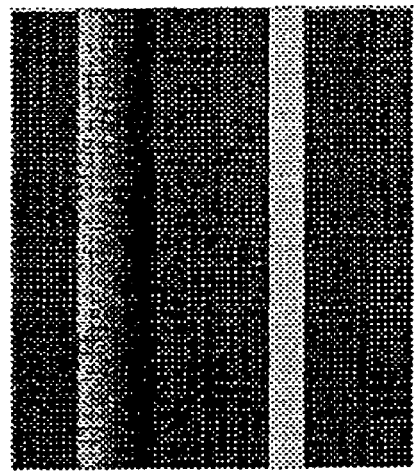

SYSTEM AND METHOD FOR EVALUATING A SEMICONDUCTOR DEVICE PATTERN, METHOD FOR CONTROLLING PROCESS OF FORMING A SEMICONDUCTOR DEVICE PATTERN AND METHOD FOR MONITORING A SEMICONDUCTOR DEVICE MANUFACTURING PROCESS

BACKGROUND OF THE INVENTION

The present invention relates to a semiconductor device pattern evaluating system for, in a semiconductor manufacturing process, evaluating whether the result of processing of each circuit pattern formed on a wafer is good or bad, and a method therefor, and particularly to a technology effective if applied to a method for estimating the property of a device circuit formed by a semiconductor device pattern to thereby evaluate the semiconductor device pattern.

In a conventional semiconductor circuit pattern relatively long in gate length, an electric property of a transistor has principally depended on a wiring width (gate length) of a gate wiring portion. Therefore, a scanning electron microscope (critical-dimension SEM) dedicated to measurement has heretofore been used to measure and manage the wiring width of the pattern in a semiconductor manufacturing process.

With shrink rapidly advanced in recent years, however, short channeling of each transistor has been put forward, and shape parameters for determining a device property have become more than just the wiring width.

The difference in pattern cross-sectional shape of a gate wiring will now be explained.

FIG. 2 is a diagram for describing the shape of a gate wiring pattern and abnormal shapes of gate wiring patterns.

Referring to FIG. 2, FIG. 2A shows a shape considered to be most desirable in general. A sidewall angle of each pattern sidewall is substantially vertical, and no bottom corner roundness or the like occurs in a pattern bottom.

On the other hand, FIG. 2B shows the shape of a taper, FIG. 2C illustrates the shape of a retrograde, and FIG. 2D depicts the shape of a footing (bottom corner roundness). These shapes are indicative of shape abnormalities caused because a condition for a manufacturing process is not suitable.

Since a gate length assumes the size of the pattern bottom, it is of importance that the size of the bottom is measured regardless of the shape.

In a gate process, ion implantation is performed with the wiring pattern as a mask to form a source/drain of the transistor. Therefore, the inclination of each pattern sidewall and the bottom corner roundness state exert an influence on the result of processing in the ion-implantation process, so that a device property varies.

While the evaluation of a pattern's three-dimensional shape is very important in this way, the conventional critical-dimension SEM has encountered difficulties in evaluating such a three-dimensional shape by only dimensions of a two-dimensional shape, like the width of a wiring pattern, the diameter of a contact hole, etc. Since a change in pattern shape makes a cause and hence the result of a subsequent process such as ion implantation is affected by its cause, there is a lot of uncertainty about the relationship between variations in three-dimensional shape and the property of a device formed as a result thereof.

In the scale-down advanced product as described above, it is becoming difficult to allow only the conventional wiring size to compensate for the device property. In order to ensure a desired device property in contrast, there is a need to clarify to which portion of a pattern's three-dimensional shape attention is made and with what degree of accuracy it should be managed.

However, the conventional critical-dimension SEM (Scanning Electron Microscope) is accompanied by problems that it is difficult to acquire information about the three-dimensional pattern shape, and as a device structure and a process become complex, it becomes also difficult to estimate which shape of the resultant three-dimensional pattern shape information is effective for any type of property.

If the relationship of these can be made clear, then the standard for process control becomes definite and hence stable production is enabled.

Incidentally, there is known one described in Japanese Patent Laid-open No. Hei 7(1995)-27549 as a related art relevant to the measurement of each pattern by using a critical-dimension SEM.

SUMMARY OF THE INVENTION

The present invention provides a semiconductor device pattern evaluating system for realizing a means for acquiring the information about the three-dimensional shapes of such patterns by non-destruction and evaluating the relationship between the three-dimensional information about the patterns and device properties, and a method therefor. Also the present invention provides a process monitoring method and a pattern forming process control method each of which performs suitable process management and control according to evaluated device properties.

A semiconductor device pattern evaluating system according to the present invention comprises feature index calculating means for quantifying a property of a three-dimensional shape of each pattern to be evaluated, as feature index, a database recording therein a relationship between feature index of each three-dimensional pattern shape and a device property of a circuit containing patterns each having the feature index, and device property estimating means for estimating a property of a device circuit formed by the pattern to be evaluated, on the basis of the feature index of the three-dimensional pattern shape, which have been quantified by the feature index calculating means, and the information recorded in the database.

Also a semiconductor device pattern evaluating system according to the present invention comprises feature index calculating means including: electron beam irradiating means for irradiating a converged electron beam onto a pattern to be evaluated, while scanning the same; secondary electron detecting means for detecting secondary electrons produced from the pattern by the irradiation of the electron beam by the electron beam irradiating means; and signal arithmetic processing means for dividing a secondary electron signal waveform detected by the secondary electron detecting means into a plurality of regions, based on an amount of change in signal amount, and quantifying a property of a three-dimensional shape of the pattern to be evaluated, as feature index on the basis of the size of each divided region, a database recording therein a relationship between feature index of each three-dimensional pattern shape and a device property of a circuit containing patterns each having the feature index, and device property estimating means for estimating a property of a device circuit formed by the pattern to be evaluated, on the basis of the feature index of the three-dimensional pattern shape quantified by the feature index calculating means, and the information recorded in the database.

Furthermore, a process monitoring method according to the present invention comprises the steps of recording in advance a relationship between feature index of each three-dimensional pattern shape and a device property of a circuit containing patterns each having the feature index, setting a tolerance level of a three-dimensional shape of a pattern necessary to realize a desired device property, based on information about the recorded relationship, and monitoring the presence or absence of an abnormality of a pattern forming process, based on the calculated tolerance level and feature index of a three-dimensional shape of a pattern to be evaluated.

Furthermore, a process monitoring method according to the present invention comprises the steps of recording in advance a relationship between feature index of each three-dimensional pattern shape and a device property of a circuit containing patterns each having the feature index, setting a tolerance level of a three-dimensional shape of a pattern necessary to realize a desired device property, based on information about the recorded relationship, and monitoring the presence or absence of an anormality of a pattern forming process, based on the calculated tolerance level and feature index of a three-dimensional shape of a pattern to be evaluated.

These and other objects, features and advantages of the invention will be apparent from the following more particular description of preferred embodiments of the invention, as illustrated in the accompanying drawings.

BRIEF DESCRIPTION OF THE DRAWINGS

FIG. 3 is an explanatory diagram of a database generation procedure according to the embodiment 1 of the present invention;

FIG. 6A is an electron beam image subjected to a line profile process according to the embodiment 2 of the present invention, FIG. 6B is a waveform corresponding to one line of an electron beam image, and FIG. 6C is a line profile created by averaging waveforms corresponding to N lines of an electron beam image;

FIG. 11 is a block diagram showing a configuration of a critical-dimension SEM illustrative of one example of three-dimensional pattern shape evaluating means employed in a semiconductor device pattern evaluating system according to an embodiment 4 of the present invention;

FIG. 14A and FIG. 14B are respectively diagrams for describing shade images of patterns obtained in the embodiment 5 of the present invention;

DESCRIPTION OF THE PREFERRED EMBODIMENTS

Figure 1A:
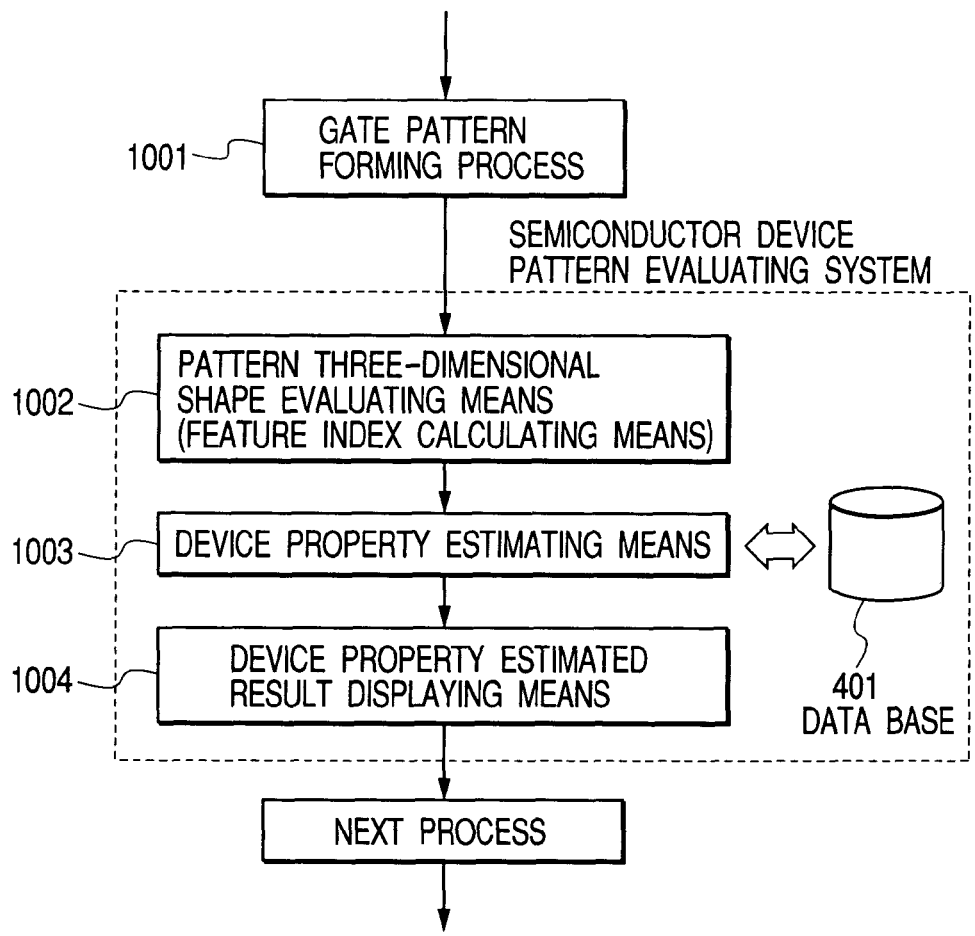
FIG. 1A is a diagram for describing a semiconductor device evaluating system according to an embodiment 1 of the present invention.

Preferred embodiments of the present invention will hereinafter be described in detail with reference to the accompanying drawings. Incidentally, the same members in all drawings for describing the embodiments are respectively designated by the same reference numerals, and their repetitive description will therefore be omitted.

(Embodiment 1)

In the present embodiment, the generation of a database about the relationship between the whole system, and pattern shapes and device properties will be described as a fundamental form.

Figure 1B:
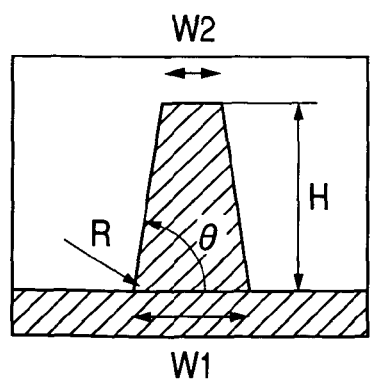
FIG. 1B is a diagram for describing feature index of a three-dimensional pattern shape.

FIG. 1 is a diagram for describing a semiconductor device pattern evaluating system according to an embodiment 1 of the present invention, wherein FIG. 1A is a configuration diagram showing one example of the semiconductor device pattern evaluating system, and FIG. 1B is a diagram for describing feature index of a three-dimensional pattern shape.

In the drawing, the semiconductor device pattern evaluating system comprises a database 401, a three-dimensional pattern shape evaluating means 1002 used as a feature index calculating means, a device property estimating means 1003, and a device properties estimated result displaying means 1004. The semiconductor device pattern evaluating system evaluates a semiconductor device pattern in which a gate pattern forming process 1001 is terminated.

In the present embodiment, the relationship between three-dimensional shape information about semiconductor circuit patterns and final device properties is registered in the database 401 in advance. A three-dimensional shape evaluation is effected on each pattern of a newly processed wafer, and the properties of a device formed by referring to the database 401 are estimated. A general MOS type transistor will be explained here with a gate pattern governing or determining its performance as an example. However, the system of the present invention can be applied, in an important process, even to other types of semiconductor devices on which research and development have been conducted actively at present, according to their device structures.

A method for generating the database 401 will first be explained using FIG. 3.

FIG. 3 is a diagram for describing a database generation procedure according to the embodiment 1 of the present invention.

In the drawing, a device properties evaluating means 1005 evaluates device properties of a semiconductor device pattern.

First of all, the three-dimensional pattern shape evaluating means 1002 performs the evaluation of a three-dimensional pattern shape of a pattern in which the processing of the gate pattern forming process 1001 is finished, and calculates feature index indicative of the three-dimensional shape. Here, the feature index of three-dimensional shape make use of widths (W1 and W2) at a predetermined height, of a top portion, a bottom portion and the like of such a pattern as shown in FIG. 1B, for example, rounding (R) of each corner, a sidewall or tilt angle (θ) of each side wall, a pattern height (H), etc. The details of a method for calculating the feature index will be described later.

Next, device properties about each pattern on which the evaluation of the feature index of these shapes is effected, are evaluated. According to this evaluation, the device properties evaluating means 1005 executes a test after the completion of all wafer manufacturing process steps to thereby measure device properties such as a Threshold voltage, a Drain current, a Leakage current, delay, speed, etc. The device properties evaluating means 1005 records these measured results in the database 401 in combination with the pre-measured group of feature index of three-dimensional shapes in advance. It is desirable that since, at this time, data about a chip having shown a problem in another defect inspection device or the like except for the formation of each gate pattern results in noise, it is eliminated in advance.

Upon the generation of the database 401, data about patterns widely containing shape variations yieldable upon actual processing may be contained. To this end, a wafer is fabricated in which, for example, the exposure and focus of an exposure device, conditions for in-plane uniformity of an etching apparatus, etc. have been changed, and patterns for each chip may be evaluated. Since the relationship between each pattern shape and device properties is different for each product, these data in the database 401 are generated every products.

An actual evaluation procedure will next be explained with reference to FIG. 1.

After the completion of processing in the gate pattern forming process 1001, the three-dimensional pattern shape evaluating means 1002 first executes the evaluation of a three-dimensional pattern shape. On the basis of the resultant group of three-dimensional pattern shape information, the device property estimating means 1003 estimates the final device property of a circuit containing evaluated patterns by referring to the information recorded in the database 401, and the device properties estimated result displaying means 1004 displays the result of estimation thereon.

At this time, the device properties evaluating means 1005 may test even each pattern whose device properties have been estimated, after the completion of all wafer manufacturing process steps, and record the result of testing in the database 401.

Figure 4:
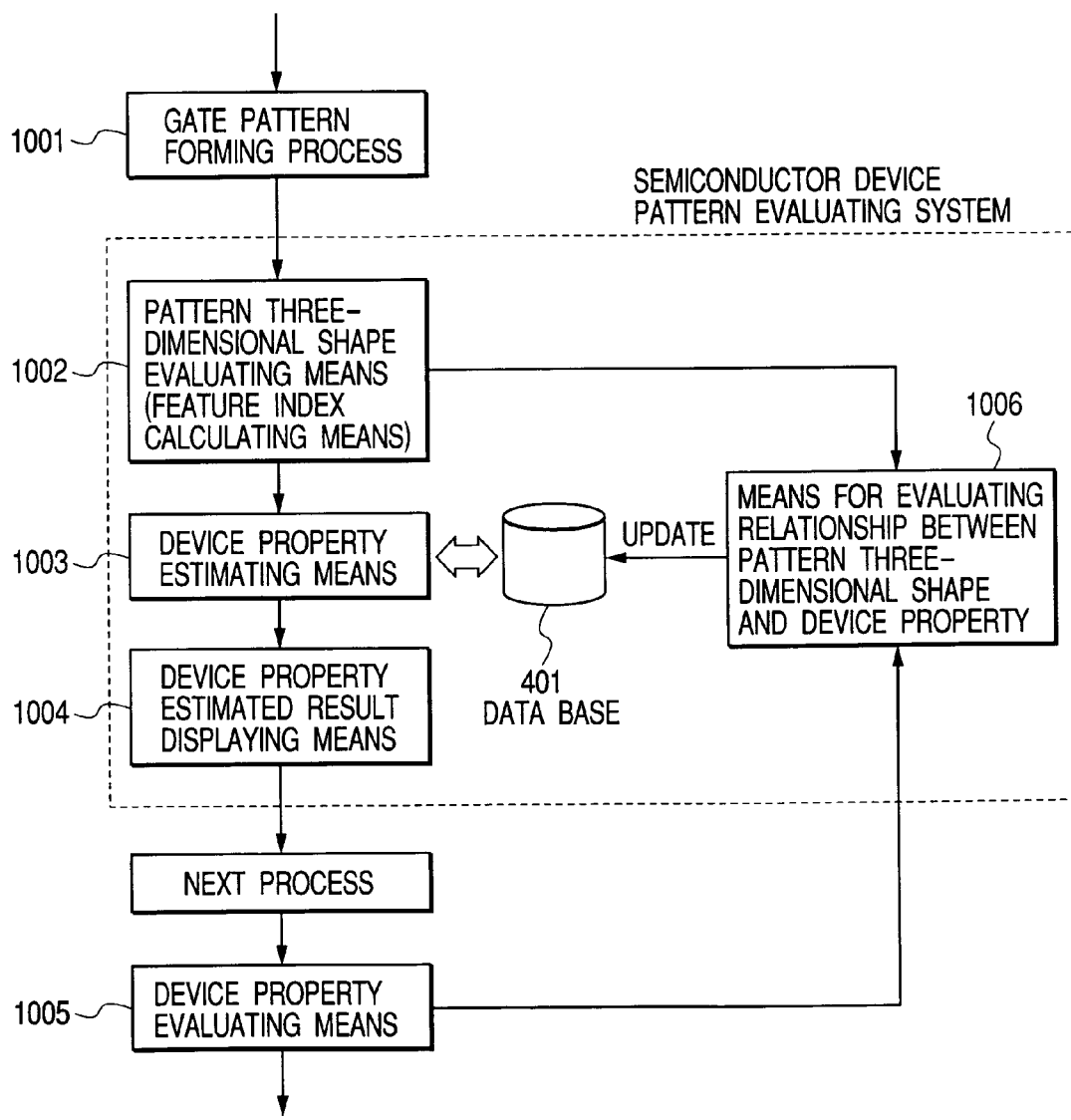
FIG. 4 is an explanatory diagram of a database updating method according to the embodiment 1 of the present invention.

FIG. 4 is a diagram for describing a database updating method according to the embodiment 1 of the present invention.

In the drawing, a means 1006 for evaluating the relationship between each three-dimensional pattern shape and device properties updates the database 401 with a combination of both the group of feature index of each three-dimensional pattern shape evaluated by the three-dimensional pattern shape evaluating means 1002 and the device properties evaluated by the device properties evaluating means 1005.

Even about these patterns on which the three-dimensional shape evaluation is effected, as shown in the example of FIG. 4, the result of evaluation of the device properties by the device properties evaluating means 1005 is added to the database 401, so that data are further accumulated therein, thereby making it possible to improve the accuracy of estimation of the device properties.

Thus, if the device properties can be estimated upon gate pattern formation, then the result of product sorting that has heretofore been performed only after the evaluation of device properties, can be estimated, and hence a subsequent production plan can be adjusted.

Further, since the bad wafer can be detected in terms of the device properties, a defect can be reliably prevented. When the processed shape is not desired, the volume of production of each product having desired performance can be adjusted by changing process conditions.

(Embodiment 2)

In the present embodiment, an example of the means for calculating the feature index indicative of the three-dimensional shape of each pattern, which is employed in the embodiment 1, will be explained.

Figure 5:
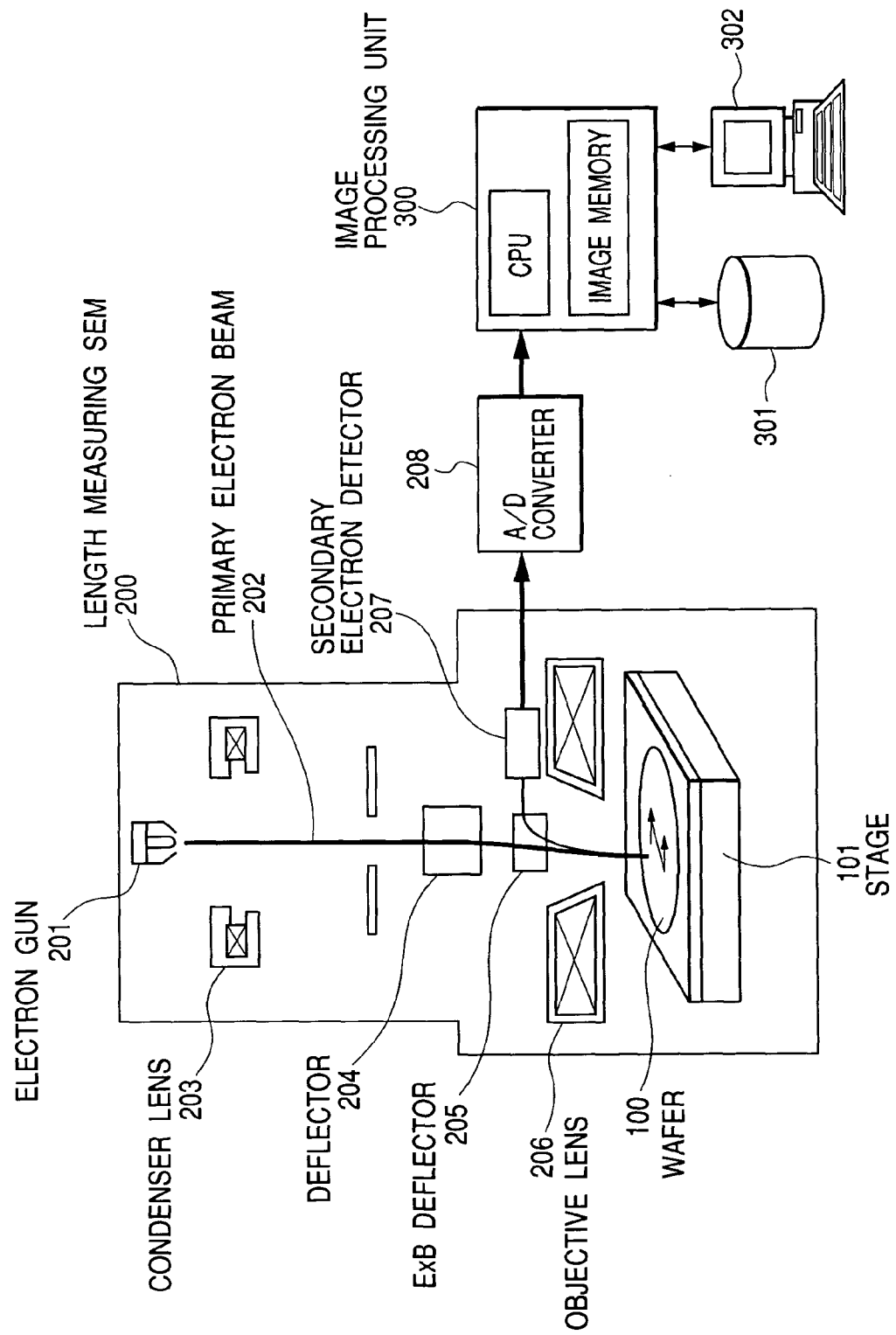
FIG. 5 is a block diagram showing a configuration of a critical-dimension SEM (CD-SEM) illustrative of one example of three-dimensional pattern shape evaluating means employed in a semiconductor device pattern evaluating system according to a second embodiment of the present invention.

FIG. 5 is a block diagram showing a configuration of a critical-dimension SEM (CD-SEM) illustrative of one example of a three-dimensional pattern shape evaluating means employed in the semiconductor device pattern evaluating system according to the embodiment 2 of the present invention.

In the drawing, the length measuring SEM 200 showing one example of the three-dimensional pattern shape evaluating means 1002 comprises a wafer 100, a stage 101, an electron gun 201, a primary electron beam 202, a condenser lens 203, a deflector 204, an ExB deflector 205, an objective lens 206, a secondary electron detector 207, an A/D converter 208, an image processing unit 300, a storage medium 301, and a display unit 302.

The primary electron beam 202 emitted from the electron gun 201 converges on the condenser lens 203, and is focused on the wafer 100 placed on the stage 101 through the beam deflector 204, the ExB deflector 205 and the objective lens 206 and irradiated thereon. When the electron beam is applied thereto, a secondary electron is produced from the wafer 100.

The secondary electron produced from the sample wafer 100 is deflected by the ExB deflector 205 and detected by the secondary electron detector 207.

Electrons produced from the sample are detected in sync with the secondary scan of an electron beam by the deflector 204 or the repetition scan of the electron beam in an X direction by the deflector 204, and the continuous movement of the wafer in a Y direction by the stage 101, so that a secondary electron image is obtained.

A signal detected by the secondary electron detector 207 is converted into a digital signal by the A/D converter 208, which in turn is transmitted to the image processing unit 300.

The image processing unit 300 includes an image memory for temporarily storing a digital image, and a CPU for calculating a line profile and feature index from the image on the image memory. Further, the image processing unit 300 has a storage medium 301 for storing a detected image or line profile, or calculated pattern shape information, etc. A display unit 302 is connected to the image processing unit 300, where the necessary operation of each device, the confirmation of a detected result, etc. can be realized through a graphical user interface.

A procedure for calculating three-dimensional shape information, which is carried out by the image processing unit 300, will next be explained using FIGS. 6 through 9.

Figure 7A:
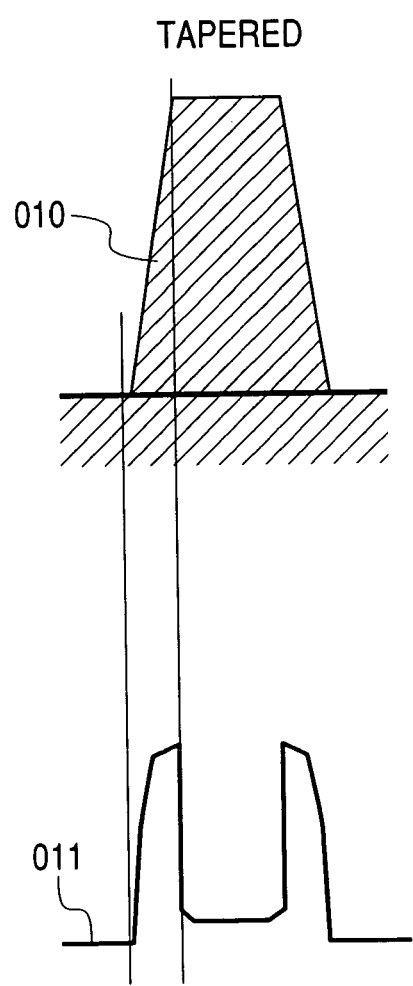
FIG. 7A is a line profile of an SEM image where a sectional shape employed in the embodiment 2 of the present invention is tapered.
Figure 7B:
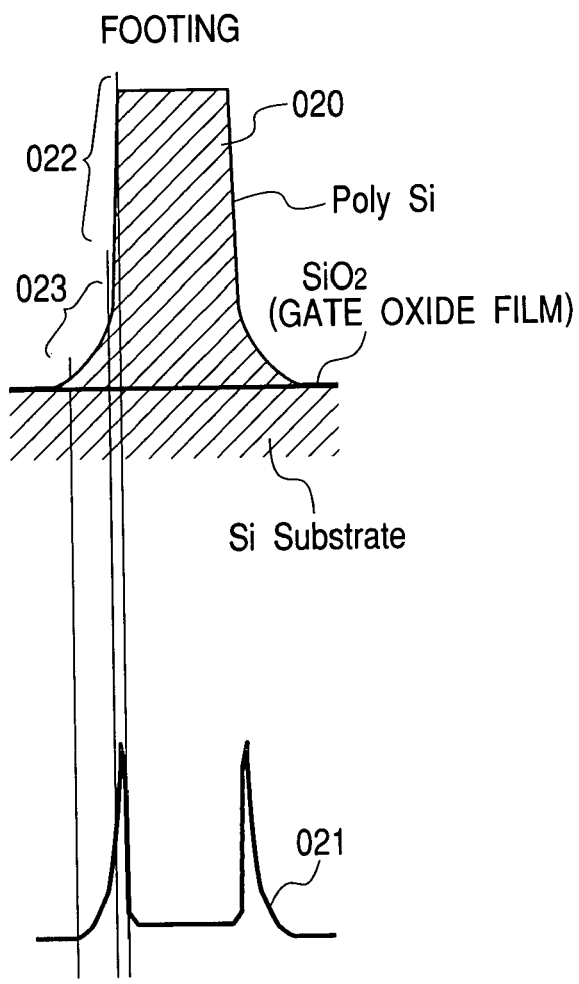
FIG. 7B is a line profile of an SEM image where a sectional shape includes footing (bottom corner roundness).
Figure 8:
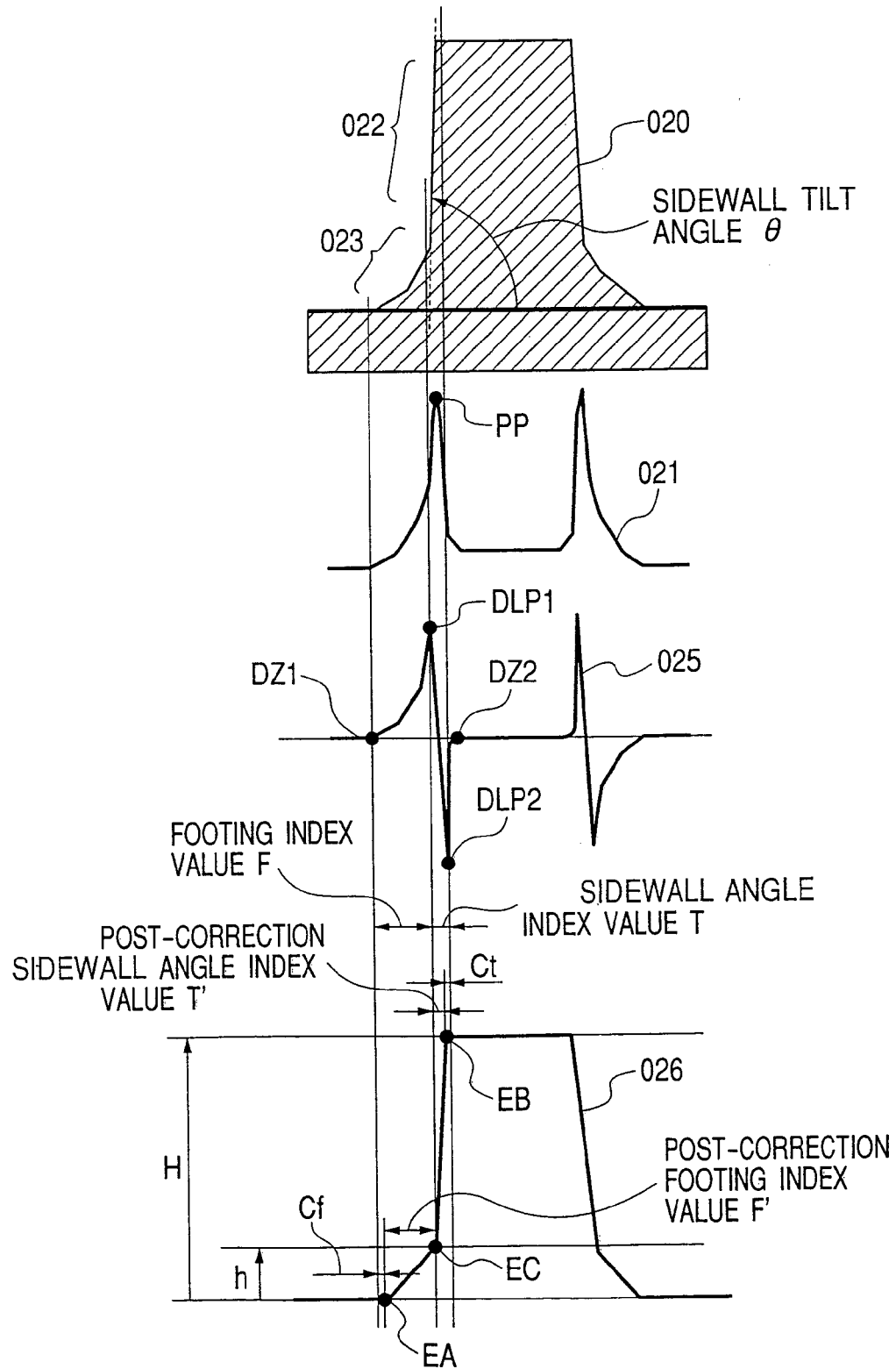
FIG. 8 is a diagram for describing a method for calculating three-dimensional shape feature index of a footing (bottom corner roundness) shape, according to the embodiment 2 of the present invention.
Figure 9:
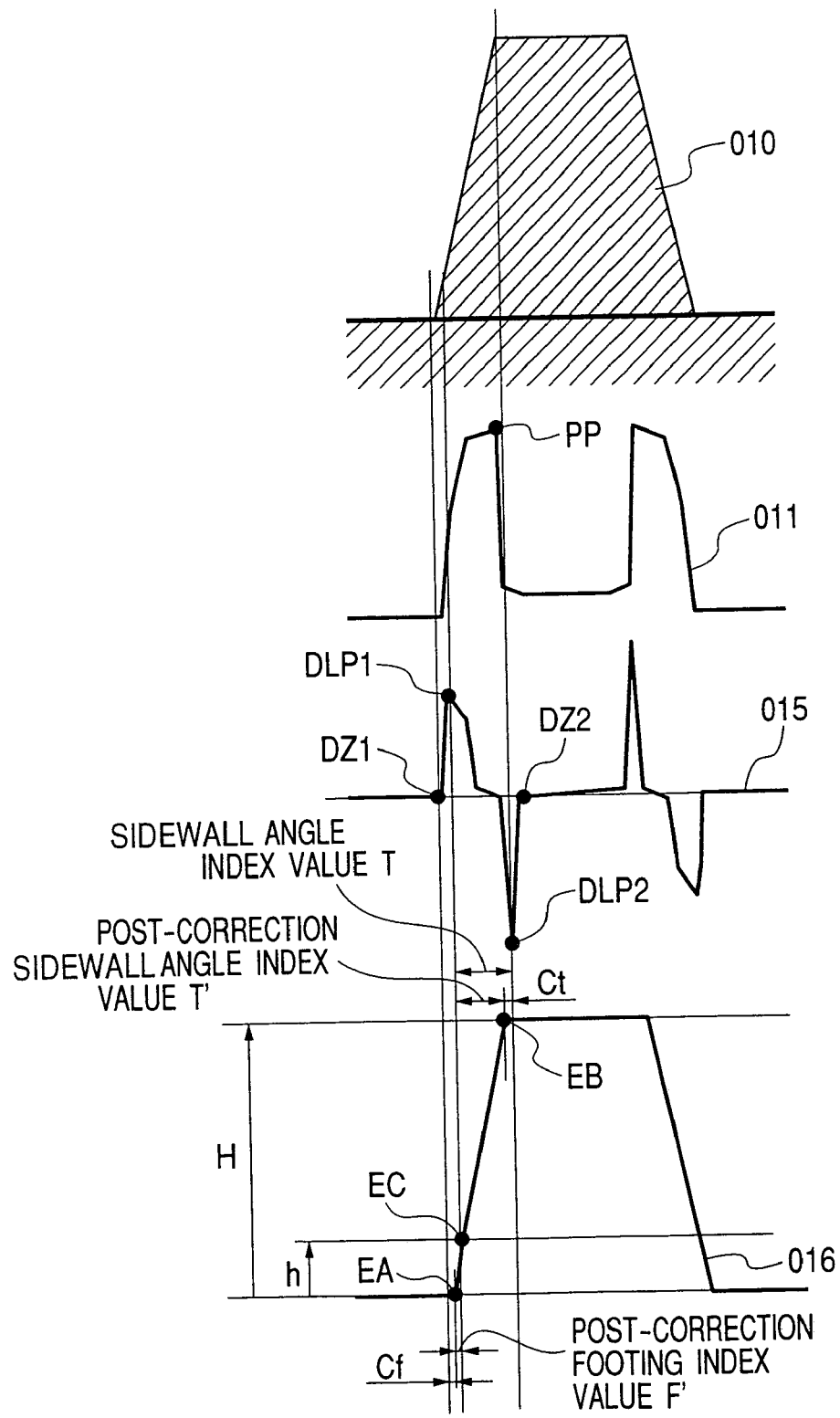
FIG. 9 is a diagram for describing a method for calculating three-dimensional shape feature index of a retrograde shape, according to the embodiment 2 of the present invention.

FIG. 6 is a diagram for describing a line profile process executed in the embodiment 2 of the present invention, wherein FIG. 6A shows an electron beam image, FIG. 6B shows a one-line waveform, and FIG. 6C shows a line profile, respectively. FIG. 7 is a diagram for describing the difference between line profiles of SEM images due to the difference in sectional shape in the embodiment 2 of the present invention, wherein FIG. 7A shows a tapered sectional shape, and FIG. 7B shows a sectional shape of a footing, respectively. FIG. 8 is a diagram for describing a method for calculating three-dimensional shape feature index of a footing shape, according to the embodiment 2 of the present invention, and FIG. 9 is a diagram for describing a method for calculating three-dimensional shape feature index of a retrograde shape, according to the embodiment 2 of the present invention.

In order to improve S/N as shown in FIG. 6, such a one-line waveform 002 as shown in FIG. 6B by way of example, of respective lines is N-line averaged with respect to such an acquired electron beam image 001 as shown in FIG. 6A thereby to create such a smooth line profile 003 as shown in FIG. 6C, for example.

This line profile 003 shows a signal level corresponding to the shape of a pattern.

The details of the relationship between the signal level and each pattern sectional shape will next be described.

It is known that a signal amount at a sidewall increases with respect to a sidewall angle $\theta$, and a secondary-electron signal amount increases in proportion to $1/\cos\theta$. Therefore, a line profile 011 abruptly increases from the bottom edge when, as shown in FIG. 7A, no bottom corner roundness occurs in a sectional shape 010 and the entire sidewall is held at a relatively high sidewall angle.

When a sectional shape 020 has bottom corner roundness as shown in FIG. 7B, a secondary electron signal amount of a bottom corner roundness portion 023 decreases as compared with an upper portion 022 held at a relatively high sidewall angle. Therefore, sectional shape information is acquired according to the following procedure through the use of the above.

The shape shown in FIG. 7B is first divided into a portion relatively small in signal amount and a portion large in signal amount, so that it can be partitioned into the portion 022 held at the high sidewall angle and the bottom corner roundness portion 023 by only the SEM image observed from the upper surface of the sample.

When a first derivative waveform 025 of a resultant line profile 021 is formed as shown in FIG. 8, it results in a waveform having peaks (DLP1 and DLP2) at locations where the original line profile 021 suddenly changes in brightness.

Therefore, a portion between these peaks DLP1 and DLP2 is equivalent to the portion 022 relatively high in sidewall angle, even within the sidewall. Thus, the distance between these peaks will be defined as a feature index T of the sidewall angle.

On the other hand, a bottom corner roundness portion relatively low in sidewall angle is represented from the outer maximum value (DLP1) of a first derivative waveform of an edge portion to a point (DZ1) where the differentiated waveform reaches zero, i.e., a point where it reaches the same brightness as a base. Therefore, the distance between these will be defined as a bottom corner roundness feature index F. Similarly, if the distance between the inner peak and the zero point is measured, it can be used as an index indicative of rounding of a pattern top portion.

On the other hand, it is understood from the result of measurement of the feature index of the shape shown in FIG. 7A that as shown in FIG. 9, the sidewall-angle feature index T is proportional to $\tan(\pi-\theta)$ if a pattern height H is constant, where if $\theta$ approaches the vertical, its value becomes small as is understood by comparison with FIG. 8. Since there is no information about the sidewall portion in the case of the retrograde, and only a portion based on an edge effect is detected, the sidewall-angle feature index T remains at a constant value.

In contrast, the bottom corner roundness feature index F results in a feature index which assumes a large value as the bottom corner roundness becomes large. Incidentally, the sidewall angle may of course be estimated with the sidewall-angle feature index as the base and used as a new feature index. The sidewall angle $\theta$ can be determined from the following (expression 1):

$$\theta = \pi - a\tan(T/H) \qquad \text{(expression 1)}$$

Since the bottom corner roundness and sidewall-angle feature index are separately measured at the left and right edges, such patterns that both sides of a wiring are asymmetric, can also be evaluated in consideration of it.

If the positions of DLP1 are determined at the left and right edges of wiring patterns and the distances therebetween are calculated in FIGS. 8 and 9 respectively, then the widths of pattern bottom portions excluding the bottom corner roundness sections are judged or found. If the distance between DZ1 is determined, then a bottom width having taken bottom corner roundness into consideration is obtained, and if the distance between DLP2 is determined, then the width of a top portion is obtained.

All of such values can be used as the three-dimensional shape feature index.

Incidentally, although the line addition average is taken to remove noise in FIG. 6, the measurement of line edge roughness is also enabled if the number of lines to be added is reduced and the width is measured at plural points along the wiring. This can also be used as one of shape feature index. At this time, the line edge roughness of the top and bottom and the like of the pattern may of course be used as discrete feature index.

Although the signal waveform is divided into the high sidewall-angle portion and the low sidewall-angle portion by use of the first derivative value in the present embodiment, a similar result can be obtained even if a suitable threshold value is used and a profile waveform is divided into regions according to the value of a signal amount itself.

Although it is not clear that the size of any portion of the pattern has been measured in the case of the conventional critical-dimensional values, the wiring widths of the bottom and top portions or the like can be reliably measured in the present embodiment.

If the calculation of these feature index is used, then a pattern evaluation having considered a three-dimensional shape can be performed in throughput substantially identical to the conventional critical-dimension SEM.

Further, if the estimation of device properties by the three-dimensional pattern shape shown in FIG. 1 of the embodiment 1 is done using these feature index, then the result of product sorting that could heretofore be done only after the evaluation of the device properties, can be estimated, and hence its subsequent production plan can be adjusted.

Further, since the tolerance level of the respective shape feature index can be set from the tolerance level of the device properties, the bad wafer can be detected in terms of the device properties, and a defect build-up can be reliably prevented. When the processed shape is not desired, the volume of production of each product having desired performance can be adjusted by changing processing conditions.

Incidentally, although the present embodiment has shown the example of the method for calculating the feature index using SEM as one example of the three-dimensional pattern shape evaluating means 1002, the feature index may of course be calculated by using Scatterrometry, AFM or the like as the three-dimensional pattern shape evaluating means 1002.

(Embodiment 3)

While the embodiment 2 has described the means for calculating the feature index of the pattern shape from the SEM image, the present embodiment will explain a technique for estimating a sectional shape of a pattern, and a method for calculating three-dimensional shape feature index using the result of estimation.

Since shape parameters that exert an influence on device properties, change according to a process, they may preferably be set by an engineer who has grasped the process. Thus, a description will be made of a means for allowing a user to set whether the user desires to perform an evaluation using feature index of any part of a pattern shape.

A method for estimating an outline of a pattern sectional shape, using the feature index obtained in the embodiment 2 shown in FIGS. 8 and 9.

Such corrections as shown in the following (expression 2) and (expression 3) are effected on T and F shown in FIGS. 8 and 9 in consideration of an edge effect and the resolution of an SEM image:

$$T'=T-ct \quad \text{(expression 2)}$$

$$F'=F-cf \quad \text{(expression 3)}$$

where ct and cf are constants.

ct indicates the width of an edge portion observed even if the pattern is perfectly vertical. This is a value principally determined by the edge effect of a top portion and may be measured in advance with a suitable sample.

cf is an offset component observed even where there is no bottom corner roundness. This principally depends on the diameter of a primary beam, a distribution of secondary electrons produced inside a target, and the like, the resolution of the SEM image.

Using these T' and F', the outside F' and a point EA zero in height (corresponding to the height identical to the base), and the inside T' and a point EB whose height is H (the same height as an upper surface of a film to be processed) are determined with the first derivative outer peak DLP1 as the reference. This film thickness H is determined according to a growth process.

Since the film thickness is controlled with high accuracy by using a film thickness measurer or the like in the case of a normal production line, H can be handled as the already-known value. Th value of H may use the result of film-thickness measurement of an actually-measured target wafer or specs at film growth.

Let's now assume the height as a suitable height h. Then a point EC at a height h with respect to the reference point (DLP1) is obtained. These points EA, FB and EC are connected to one another so that about the pattern sectional shape can be estimated as shown in FIGS. 8 and 9.

Here, h indicates the height equivalent to a point where an etching condition is changed. As h, a rough value may be examined in advance from an etching rate at each step, a processing time interval set to a recipe, etc.

A method for allowing a user to set whether the user desires to perform an evaluation using feature index of any part of the three-dimensional pattern shape, on the basis of the result of estimation of the sectional shape obtained in this way will next be explained using FIG. 10.

FIG. 10 is a diagram for describing a graphical user interface for selection of three-dimensional shape feature index by the embodiment 3 of the present invention.

Figure 10A:
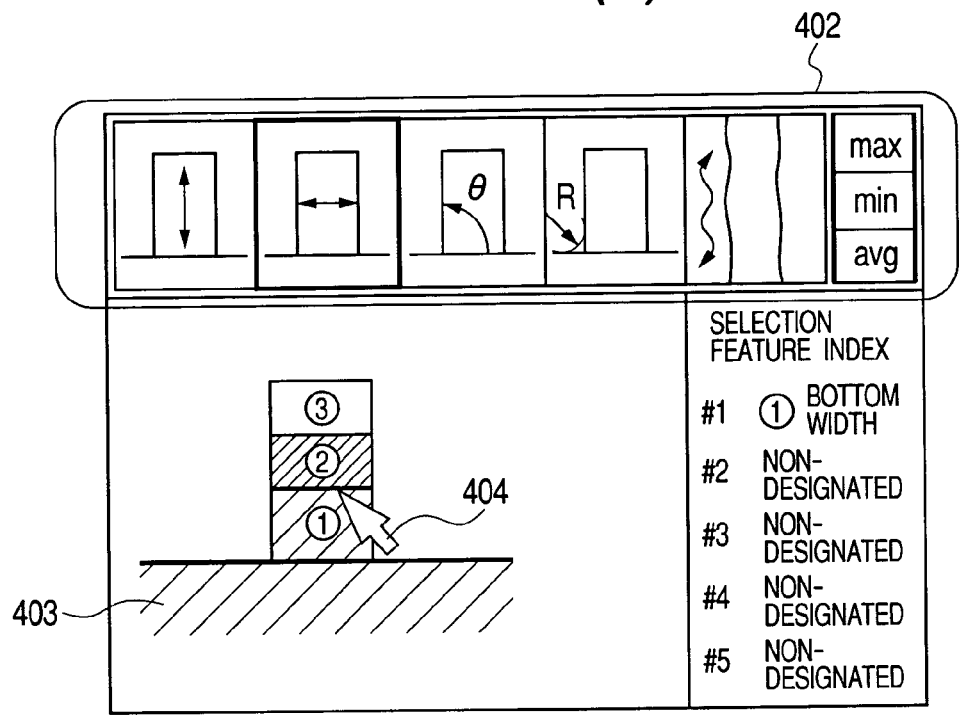
FIG. 10A is a graphical user interface for selecting three-dimensional shape feature index by an embodiment 3 of the present invention.

Referring to FIG. 10A, a sectional structure (represented by a material, a wiring width, and a film thickness on the basis of design values) is represented as a structure diagram 403. Instrumentation shapes constituent of the width, height, angle, corner rounding, and line edge roughness, and items for the maximum, minimum and average to be measured are selected by a button 402. Thereafter, a point to be measured is dragged on the structure diagram 403, so that whether any part of a sectional profile should be used as shape feature index, can be determined. While FIG. 10A shows the example of the structure in which films composed of plural materials are stacked, a method for evaluating a pattern shape of such a stacked structure will be described later.

Figure 10B:
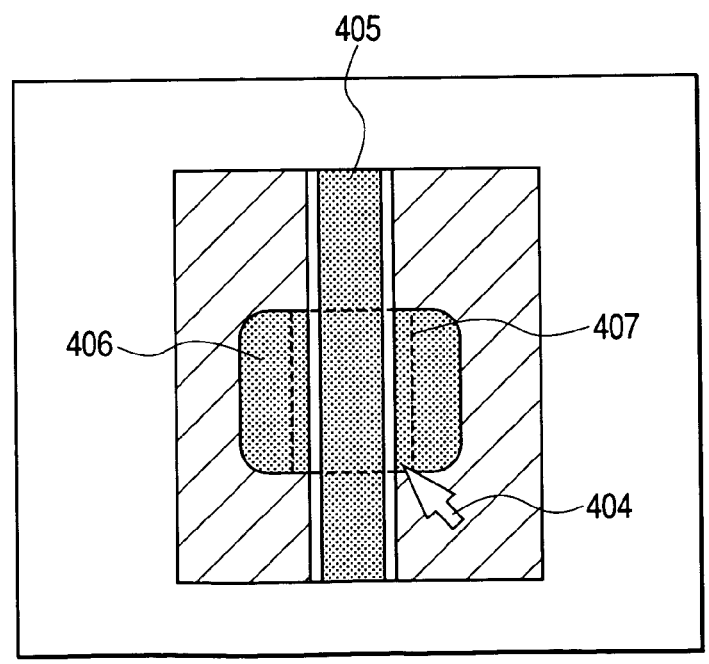
FIG. 10B is a screen for setting a position to be measured through the graphical user interface.

FIG. 10B shows an example of a setting screen for determining a measured position by use of an SEM image from an upper surface. In FIG. 10B, an active area 406 formed with a transistor, of a gate wiring pattern 405 can be selected (407) with a mouse.

Since the size of a device portion of the transistor is important in order to evaluate the properties of the transistor, a measuring range is set according to each target device, and hence the accuracy of property evaluation can further be improved.

If such a graphical user interface is utilized, then an engineer so familiar with a manufacturing process is able to freely select three-dimensional shape feature index estimated to have a significant influence on the device properties.

Incidentally, although the present embodiment has shown the example of the sectional shape estimating method using the SEM, the method for estimating the sectional profile of the pattern may of course make use of scatterrometry, AFM or the like.

By allowing the user to freely select the three-dimensional shape feature index intended for evaluation in this way, the engineer having grasped the process is able to selectively set parameters important in particular.

Since new shape feature index can easily be added even when the relationship between the three-dimensional shape and the device properties cannot be confirmed clearly, deep-connected parameters can reliably be discriminated.

(Embodiment 4)

Although the embodiment 3 has described the method of estimating the sectional three-dimensional shape by using only the Top-down view of the secondary electron image, the present embodiment will explain a method for further improving the accuracy of estimation of a three-dimensional shape by use of different electron beam images.

Figure 12:
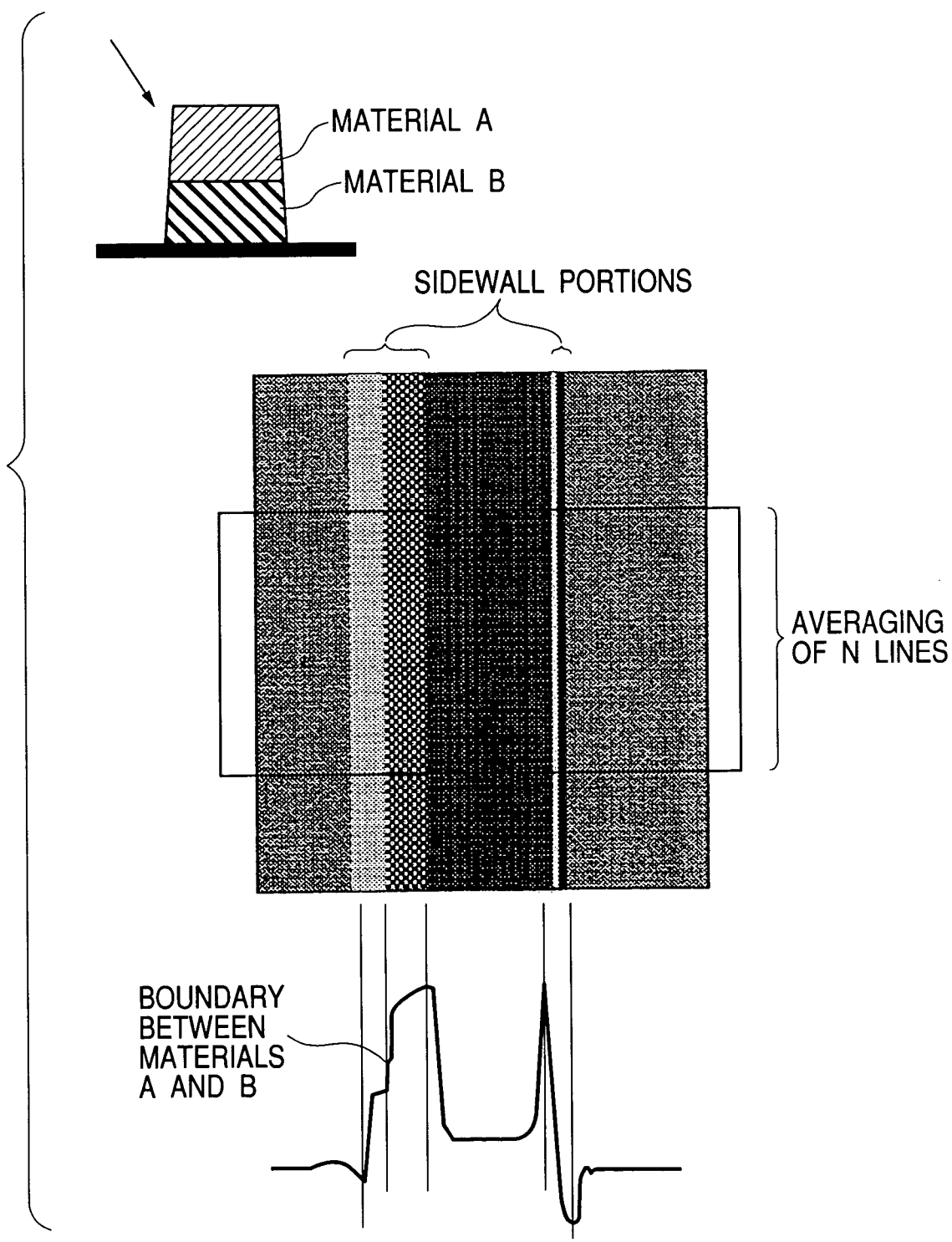
FIG. 12 is a diagram for describing a waveform process according to the embodiment 4 of the present invention.

FIG. 11 is a block diagram showing a configuration of a critical-dimension SEM illustrative of one example of a three-dimensional pattern shape evaluating means employed in a semiconductor device pattern evaluating system according to the embodiment 4 of the present invention. FIG. 12 is a diagram for describing a waveform process employed in the embodiment 4 of the present invention.

Referring to FIG. 11, the length measuring SEM 200 employed in the present embodiment has a tilt stage 102 movable within an XY plane and provided with a tilt function, and is capable of obtaining a tilt image in addition to a normal top-down view image.

In the tilt image, a left resist sidewall equivalent portion increases in the number of pixels, and a right sidewall equivalent portion decreases in the number of pixels (where the inclination of the tilt stage is right-upward toward a sample).

A point to be noted in the present embodiment is a line profile of the resist sidewall equivalent portion on the increasing side of the number of pixels. Since the influence of an edge effect and beam resolution can be avoided if an inclined plane can be detected with a sufficient width, shape feature index can be obtained with higher accuracy.

Since the number of pixels equivalent to the sidewall portion decreases in the top-down view image where different types of films such as a Poly-Metal gate are formed as a multilayer film stacked in a multilayer form, the detection of the position at the boundary between the films was difficult. However, if the tilt image is used as shown in FIG. 12, then the boundary can be easily detected. If the boundary position of the multilayer film can be detected, then a pattern's sectional shape can be also estimated in a manner similar to the embodiment 3 with information about their film thicknesses as a base.

Figure 2A:
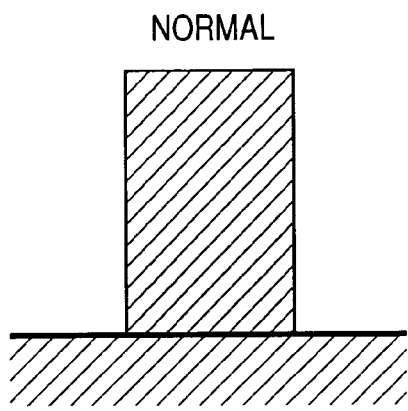
FIG. 2A is a shape of a gate wiring pattern, which is considered to be most desirable.
Figure 2C:
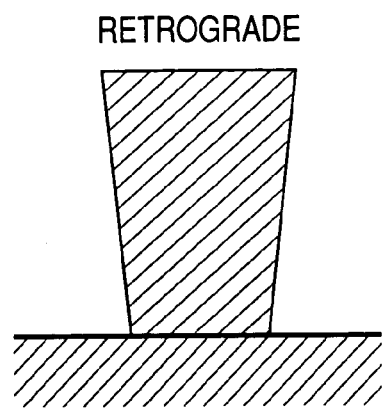
FIG. 2C is a retrograde shape of a gate wiring pattern.
Figure 2B:
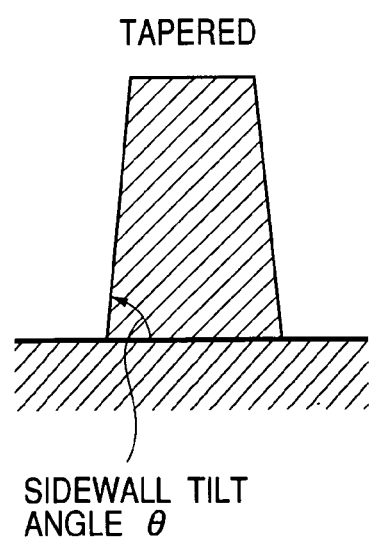
FIG. 2B is a tapered shape of a gate wiring pattern.
Figure 2D:
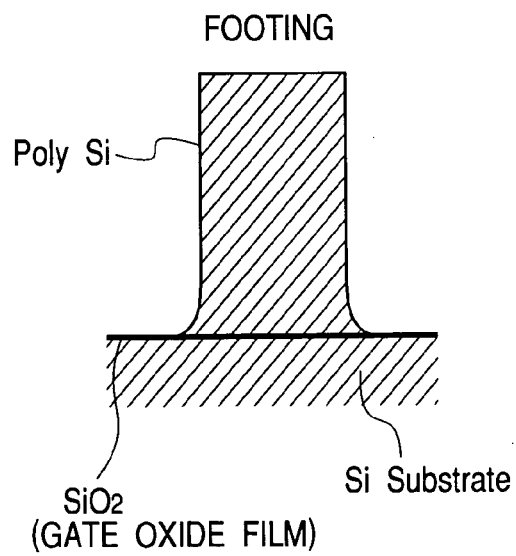
FIG. 2D is a shape of a footing of a gate wiring pattern.

In the top-down view, it was difficult to recognize such a retrograde as shown in FIG. 2C as such a normal pattern as shown in FIG. 2A. However, an offset can be added to a feature index of a sidewall angle owing to a tilt, so that the retrograde can be detected.

In the present embodiment, the length measuring SEM 200 is also capable of acquiring the normal top-down view image and the tilt image and calculating the height of a pattern according to the principle of stereo vision.

The sectional shape estimating method described in the embodiment 1 has utilized the film-thickness information. However, while there is a need to detect the height too where such film-thickness information cannot be obtained, the absolute height of the pattern can be directly detected in the present embodiment.

Incidentally, a column of an electronic optical system may of course be tilted in place of the stage being tilted. Alternatively, the angle incident to a sample may of course be changed by changing the angle of deflection of an irradiated electron beam.

If the three-dimensional shape evaluation according to the present embodiment is utilized in combination with the embodiment 1, then higher-accuracy shape information can be obtained, by extension, a more accurate evaluation is enabled because the number of the pixels equivalent to the sidewall portion increases owing to the use of the tilt image in addition to effects similar to ones described in the embodiments as before.

Furthermore, the top-down view enables even the measurement of a non-measurable retrograde within a predetermined range.

(Embodiment 5)

Although the embodiment 3 has described the case in which only the SEM image observed from the upper surface is used, and the embodiment 4 has described the method for utilizing the tilt image in combination with other, the present embodiment will explain a method for acquiring three-dimensional shape information, using a back scattered electron image.

Figure 13:
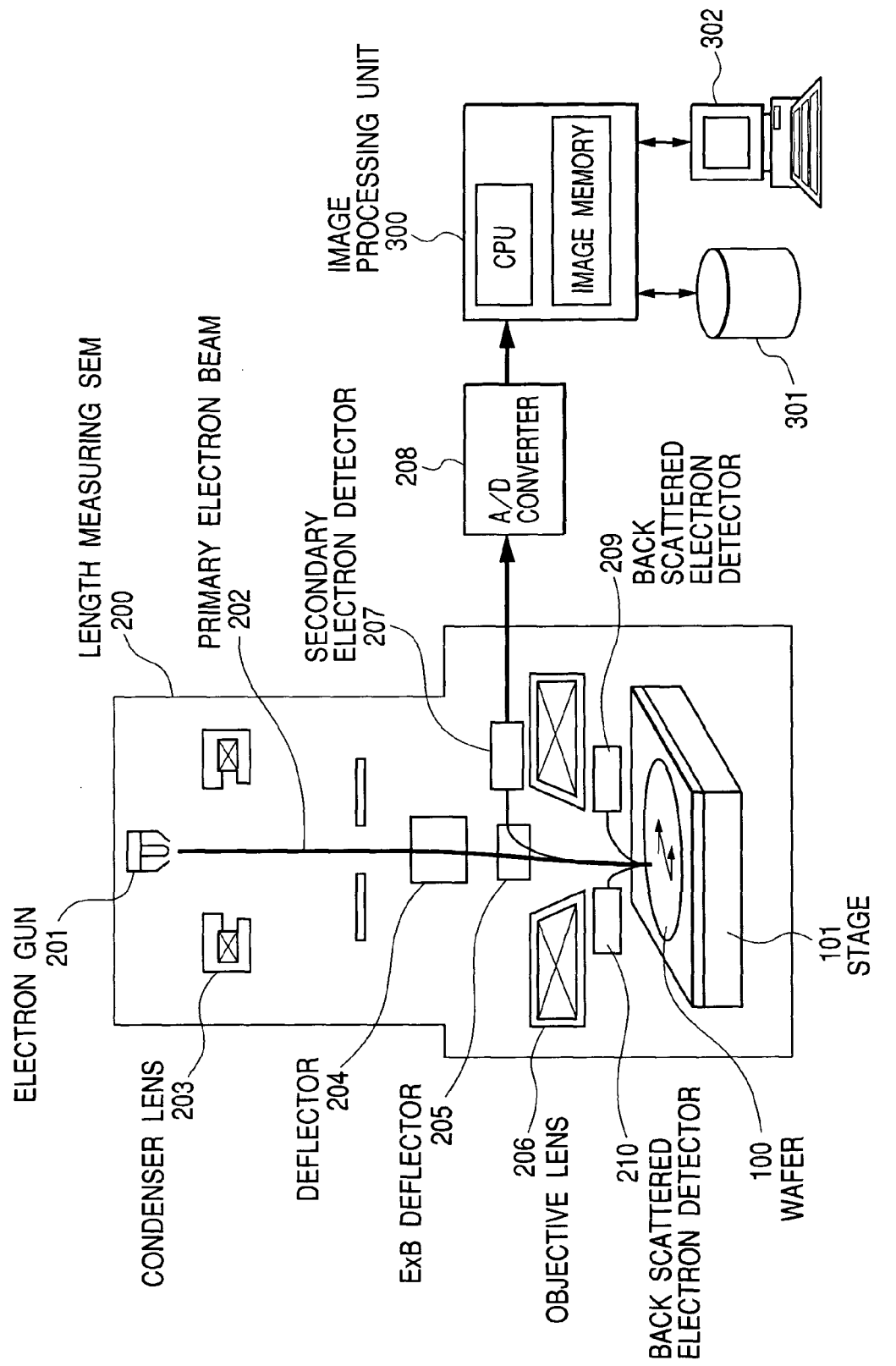
FIG. 13 is a block diagram showing a configuration of a critical-dimension SEM illustrative of one example of three-dimensional pattern shape evaluating means employed in a semiconductor device pattern evaluating system according to an embodiment 5 of the present invention.

FIG. 13 is a block diagram showing a configuration of a critical-dimension SEM illustrative of one example of a three-dimensional pattern shape evaluating means employed in a semiconductor device pattern evaluating system according to the embodiment 5 of the present invention. FIG. 14 is a diagram for describing waveforms detected in the embodiment 5 of the present invention.

Referring to FIG. 13, the critical-dimension SEM used in the present embodiment has back scattered electron detectors 209 and 210 and is capable of obtaining such shade images as shown in FIGS. 14($a$) and 14($b$) in addition to a normal top-down view image.

After the acquisition of such back scattered electron images, the tilt intensity of an edge portion of a pattern is calculated from each of the images and utilized in combination with the shape feature index employed in the embodiment 1, whereby higher-accuracy estimation of a sidewall angle is carried out.

Since the back scattered electron is strong in material dependence as compared with a secondary electron, the present embodiment can also cope with a multilayer film in which different types of films are stacked, using this property.

It is generally known that a back scattered electron image depends on the atomic number of a target and changes in signal amount. Therefore, a change in signal amount appears even depending on the difference in material as well as the difference in sidewall angle.

Thus, if attention is given to the change in signal amount and a line profile is divided according to the boundary between materials in a manner similar to the embodiment 4, then the estimation of a sectional shape of a pattern is also enabled in a manner similar to the embodiment 1 with information about their film-thicknesses as a base.

In a manner similar to the embodiment 4, the detection of height of the pattern may be performed using a tilt image of back scattered electrons, or the feature index of a sidewall may be acquired.

By utilizing the present embodiment in combination with the embodiment 1, information descriptive of the tilt intensity of the pattern edge portion is additionally provided in addition to an effect similar to the already-known one, thereby making it possible to execute a more accurate pattern evaluation.

(Embodiment 6)

The present embodiment will explain a method for evaluating the degrees of similarity between sets of three-dimensional shape feature index of patterns to be evaluated, and sets of three-dimensional shape feature index recorded in a database 401 according to a pattern matching procedure and outputting a device property numeric value of a pattern having a set of three-dimensional shape feature index highest in similarity as a result.

In the present embodiment, the sets of three-dimensional shape feature index such as pattern widths, sidewall angles, etc. are defined as S1, S2, . . . , SN, and the sets of three-dimensional shape feature index recorded in the database 401 are defined as Si1, Si2, . . . , SiN (where N indicates the number of used feature index, and i indicates numbers of patterns recorded in the database 401). The degree of difference or dissimilarity Di from data i is evaluated from the following (expression 4):

$$Di = SUM(((Sj-Sij) \times Wj) \times ((Sj-Sij) \times Wj)) \quad (4)$$

where SUM () indicates an arithmetic operation for determining the sum of j=1, 2, . . . N, and Wj indicate weighting factors.

The weighting factors Wj are used to assign suitable weights according to the importance of their shape feature index. Even when feature index different in dimension, such as the length, angle, etc. are utilized in combination, the weighting factors are used for these conversions.

For example, they are used according to a method of setting the allowable numeric values of their three-dimensional shape feature index and performing normalization, based on the allowable numeric values.

The sets of feature index recorded in the database 401 and the degree of dissimilarity are calculated, and the device properties of a pattern i lowest in the degree of dissimilarity may be outputted as device property estimated numeric value of a pattern to be evaluated. Here, a suitable threshold value is set to the value of the degree of difference. When the degree of difference is large, no similar patterns exist, and hence their measurements may be judged to be incapable.

According to the present embodiment, the device properties of each pattern to be evaluated can be estimated from the database 401 by a relatively simple arithmetic operation.

(Embodiment 7)

The present embodiment will explain a method for selecting parameters strongly correlated with device properties from a plurality of three-dimensional shape parameters and estimating device properties of each newly-processed pattern on the basis of their relationships.

Figure 15A:
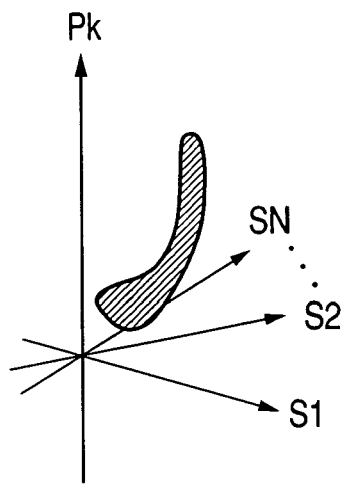
FIG. 15A is a diagram for describing that the relationship between a three-dimensional pattern shape and device properties according to an embodiment 7 of the present invention is obtained by a regression analysis.
Figure 15B:
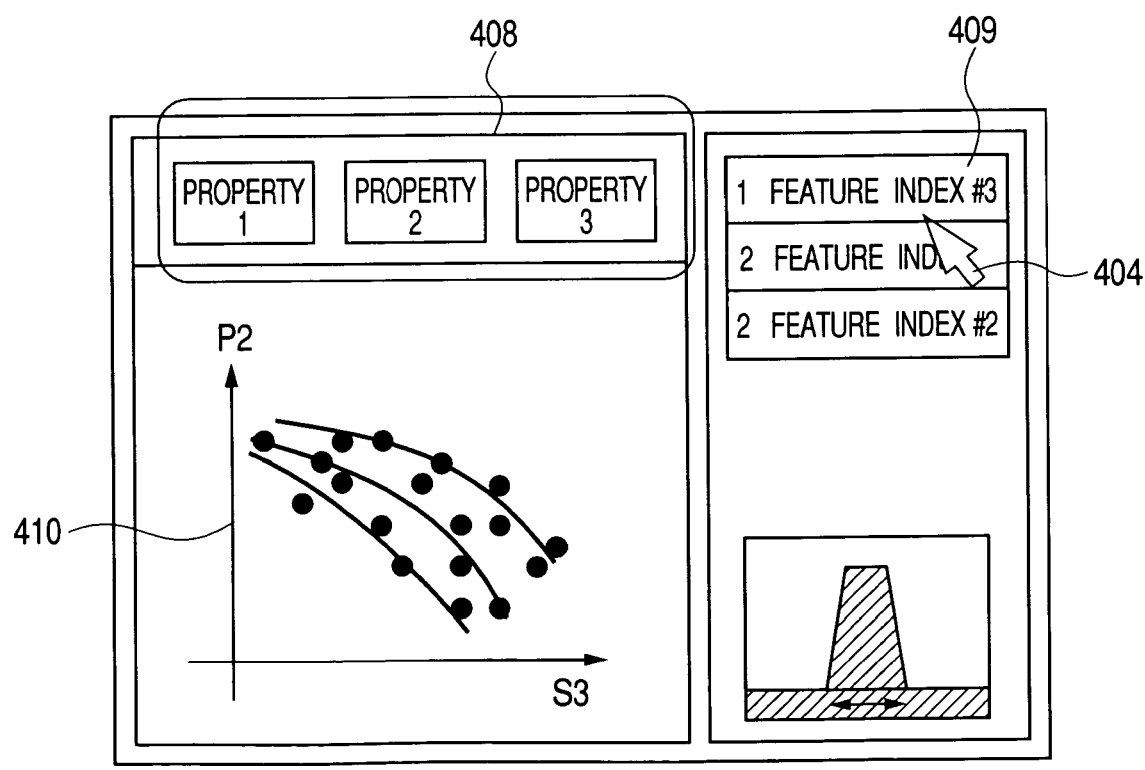
FIG. 15B is a diagram showing one example of a display of the result of regression analysis.

FIG. 15 is an explanatory diagram showing a relationship between three-dimensional pattern shape feature index and device properties both employed in the embodiment 7 of the present invention, wherein FIG. 15A is an explanatory diagram for determining a relationship between a pattern shape and device properties by a regression analysis, and FIG. 15B shows one example of a method for displaying the result of above regression analysis.

First, the estimation of device performance where a gate pattern has a certain group of three-dimensional shape feature index can be performed by a technique of a multi-variate analysis.

If the relationship between the pattern shape and device properties has already been obtained as shown in FIG. 15A, for example, then the relationship of these can be determined by the regression analysis.

At this time, the regression analysis is effected on their three-dimensional shape feature index to thereby exclude feature index ineffective for estimation by use of a method such as a variable reduction method. Only feature index related to target device properties are left behind.

If the strength of a relationship of respective three-dimensional shape feature index is displayed for every device properties with respect to the so-obtained relationship between the device properties and each three-dimensional shape, and the corresponding three-dimensional shape feature index are selected from therewithin, it is convenient if the function of displaying the contents of the database 401 is added such that the relationship between the feature index and the device properties is graphic-represented.

One example of its display is such a display as shown in FIG. 15B. When a target device property parameter is selected by a select button 408 in the example of FIG. 15B, candidates for three-dimensional shape feature index strongly related to its device properties are displayed on the right side of the screen together with their turns as designated at numeral 409 in FIG. 15B.

Then when the displayed corresponding feature index are selected by a pointing device 404, the selected feature index are illustrated in a lower-right typical diagram showing a cross-sectional shape, and a relationship between the selected three-dimensional shape feature index and device properties is represented in the form of a graph display 410.

Using the regression analysis in the data recorded in the database 410 in this way makes it possible to express the relationship between theses shape feature index and device properties in an expression.

Incidentally, at this time, data about a chip in which an anormality is confirmed in any of all processes on the basis of data such as other defect inspection results, is eliminated in advance because it results in noise.

If the result of analysis is displayed in the graph as shown in FIG. 15B according to the present embodiment, it can be then easily confirmed which shape of each pattern is effective for any properties.

The display of the relationship between each pattern shape and the device properties in the graph makes it possible to easily obtain information about which shape feature is important and to which extent the respective shape feature index may vary.

If such information is obtained, then the selection of shape feature index to be used for the management of each process, and the setting of their tolerance levels can be easily carried out. If the tolerance levels having taken device performance into consideration can be set to their pattern shape feature index in this way, then the monitoring of each process is also enabled using their tolerance levels.

When the shape feature index fall outside the set allowable numeric values, the occurrence of an anomality and the amount of its falling outside may be displayed.

In the present embodiment, the proper estimation of device performance can be performed even when the amount of the data in the database 401 is reduced and there is no pattern having a shape similar to a pattern to be evaluated.

If the relationship between the three-dimensional pattern shape feature index and the device properties can be expressed in the form of a function, then the estimation of device properties of a newly-processed pattern can also be carried out easily and stably with high accuracy using the present relationship. Even if the amount of information of the database 401 increases, an arithmetic operation is enabled in time independent on the database amount.

Incidentally, in the present embodiment, the device property estimating means 1003 processes or handles data processing by the regression analysis, based on the information recorded in the database 401. However, the information acquired by the regression analysis is recorded in the database 401 in advance, and the estimation of device properties may be performed based on the recorded data.

(Embodiment 8)

The present embodiment will explain a method of displaying a pattern evaluation result.

FIG. 16 is a diagram for describing an evaluation result display method descriptive of a relationship between three-dimensional pattern shape feature index and device properties employed in the embodiment 8 of the present invention.

Figure 16A:
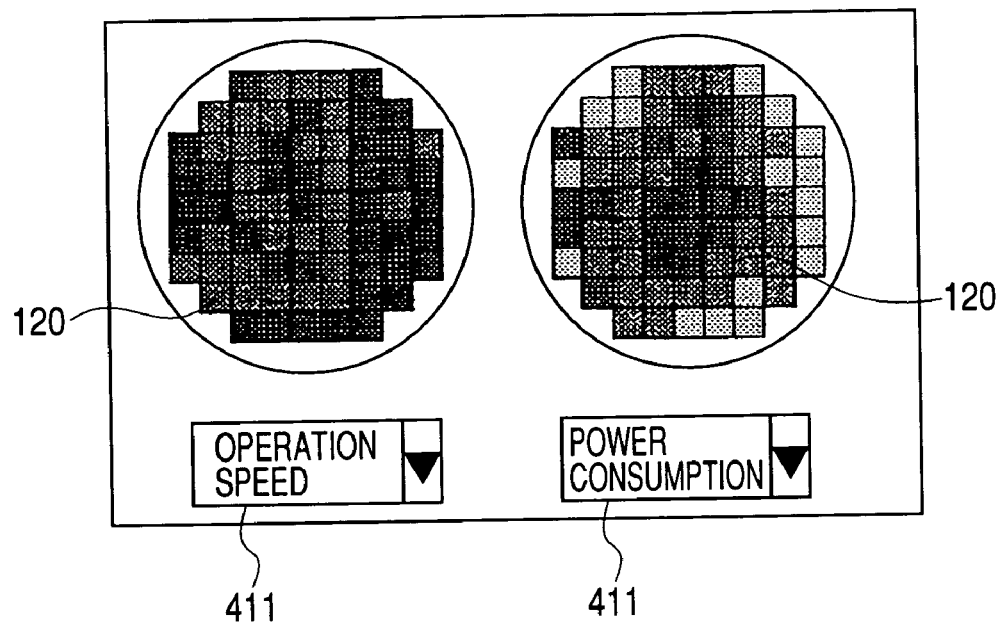
FIG. 16A illustrates estimated values of device properties selected by device properties selection boxes 411, which are displayed on a map in colors or the like with respect to respective chips in a wafer to be evaluated.

FIG. 16A illustrates estimated values of device properties selected by device properties selection boxes 411, which are displayed on a map in colors or the like with respect to respective chips in each wafer to be evaluated.

As shown in FIG. 16A, the estimated values are displayed every device properties, and whether all properties fall within a tolerance level is displayed. It is possible to easily confirm in what manner chips each capable of obtaining desired performance are distributed across a wafer. From the result, there may be cases in which the problem of a process can be made definite.

Figure 16B:
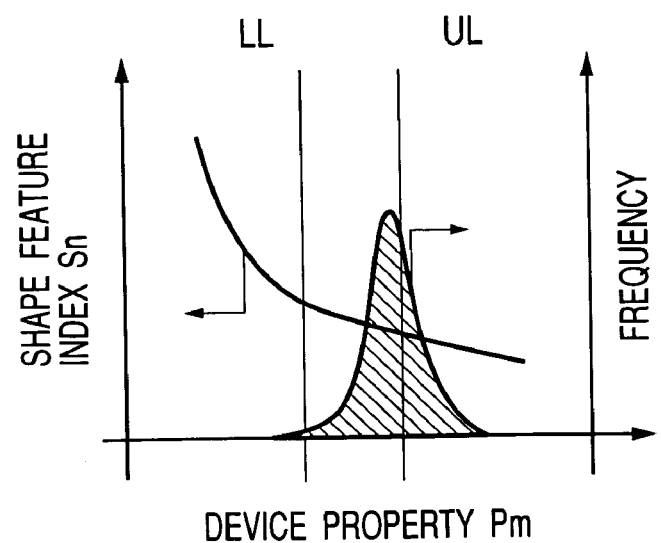
FIG. 16B is an example of a display for confirming a frequency distribution of device properties obtained by the wafer to be evaluated.

FIG. 16B is an example of a display for confirming a frequency distribution of device properties obtained by the wafer to be evaluated.

In FIG. 16B, the horizontal axis indicates device parameters designated by a user, the axis on the left side indicates three-dimensional shape feature index of each pattern closely associated with its properties, and the axis on the right side indicates the frequency, respectively. Also LL and UL respectively indicate lower limit and upper limit values.

With such a display, whether at what degree of frequency a chip having reached desired performance exists is obvious at a glance. A relationship with each pattern shape that must be most managed in order to realize each desired property, and its management value can also be recognized.

An amount of change in pattern shape, for solving a difference or dissimilarity between the present property of wafer to be evaluated and a desired property can be also recognized. Since there is a need to reduce a device property numeric value in the case of the example shown in FIG. 16B, the process may be controlled so that the three-dimensional shape feature index increase.

(Embodiment 9)

If a relationship between patterns three-dimensional shape feature index and device properties can be evaluated as described even in the embodiment 8, an amount of change in pattern shape, which is necessary to realize a desired device property, can be estimated using the relationship of these.

Thus, if a relationship between three-dimensional shape feature index of respective patterns and process parameters thereof is estimated in advance according to a pattern shape evaluating system of the present invention, then a process can be controlled based on the result of pattern evaluation.

Figure 17:
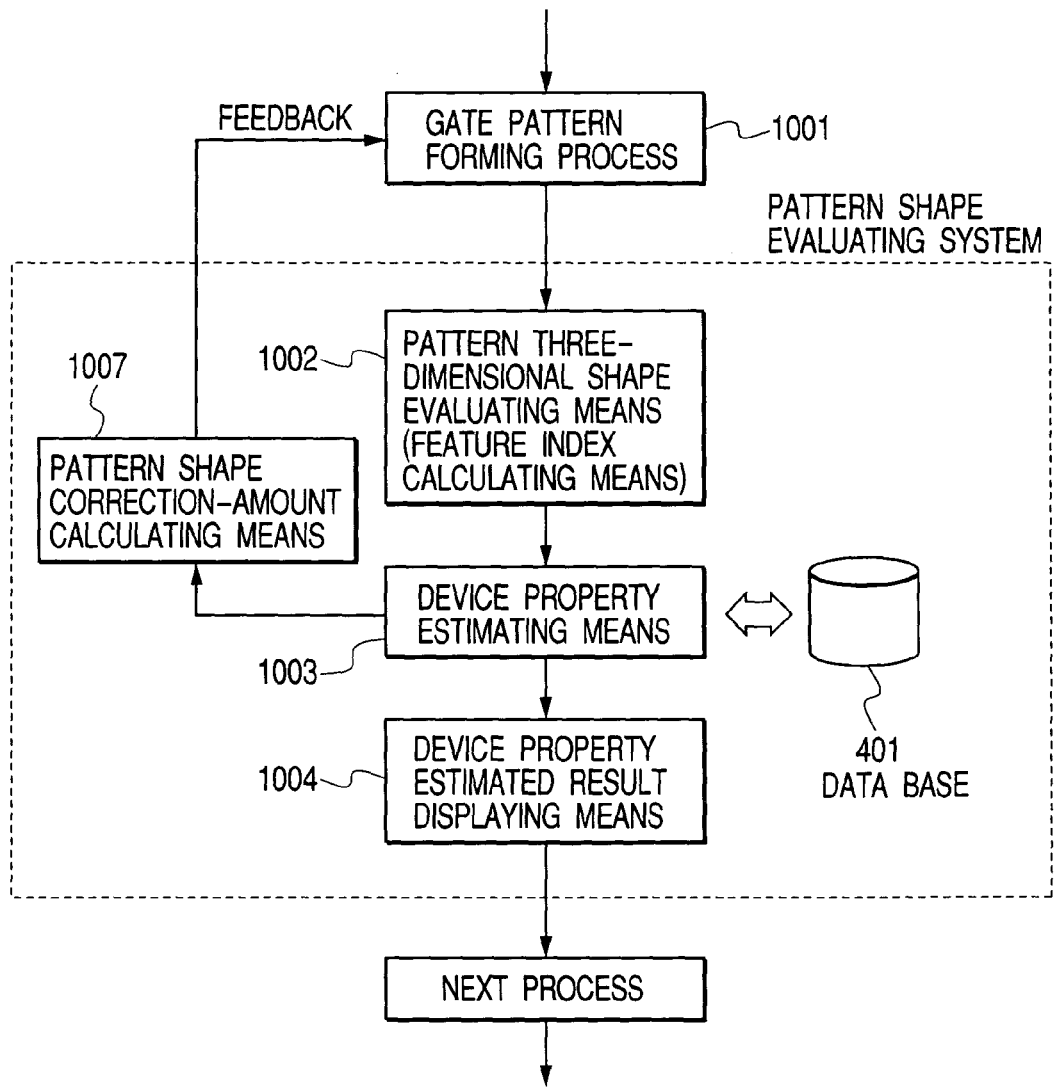
FIG. 17 is a diagram for describing a pattern forming process control method according to an embodiment 9 of the present invention.

FIG. 17 is a diagram for describing a pattern forming process control method according to an embodiment 9 of the present invention.

In the figure, a pattern shape correction-amount calculating means 1007 calculates a correction amount or value of a pattern shape, based on information supplied from a device property estimating means 1003 and feeds its information back to a gate pattern forming process 1001, thereby changing a process condition for acquiring a desired device property.

As shown in FIG. 17, the device property estimating means 1003 estimates a final device property of a circuit including an evaluation pattern by referring to information recorded in a database 401 on the basis of a three-dimensional shape information group evaluated by a three-dimensional pattern shape evaluating means 1002. Thereafter, the pattern shape correction-amount calculating means 1007 calculates the amount of a shift or displacement between the device property estimated by the device property estimating means 1003 and a target value, and calculates the amount of correction of a pattern shape by using the expression related to such three-dimensional pattern shape feature index as shown in FIG. 15B, for example.

The process condition change for obtaining the desired device property is executed in the gate pattern forming process 1001 using the relationship between the estimated pattern shape correction amounts and pre-examined process conditions such as the amount of exposure in a photo process, an etching time interval necessary for an etching process, etc.

Thus, in the present embodiment, the pattern forming process control for acquiring the desired device property is enabled owing to the use of the pattern shape evaluating system, and a satisfactory pattern-processed shape can be always maintained.

(Embodiment 10)

Upon realizing the embodiments described up to now, the pattern shape evaluating system of the present invention may be placed on, for example, the length measuring SEM 200, or other three-dimensional shape measuring apparatus, or placed on a system connected to these sold shape measuring apparatuses by a network.

Figure 18:
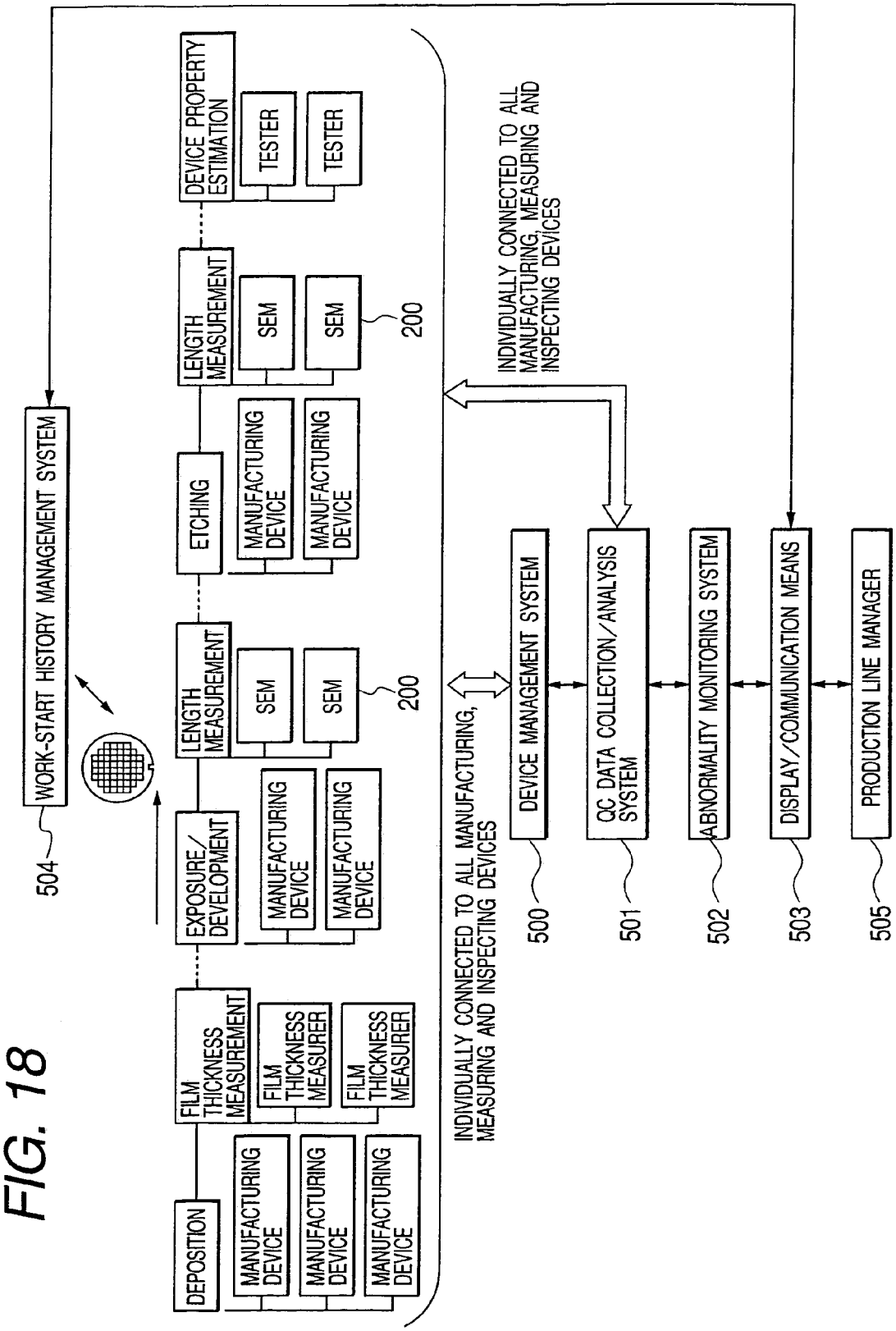
FIG. 18 is a construction example of a production line according to an embodiment 10 of the present invention.

FIG. 18 shows a construction example of a production line according to an embodiment 10 of the present invention and is a configuration wherein respective apparatuses or devices are connected by a network.

In the figure, three-dimensional shape devices (SEMs herein) 200, various manufacturing apparatuses, and a device property evaluating device are all connected to one another on the network. These are connected to a device management system 500 and a QC data collection/analysis system 501. The device management system 500 and QC data collection/analysis system 501 manage operations of respective devices and process data outputted from the devices. A work-start history management system 504 performs management of each wafer.

An anomality monitoring system 502 monitors abnormalities about these, and a production line manager 505 is able to easily confirm a state of each production line via a display/communication means 503.

In the present embodiment, for example, the operation of the three-dimensional pattern shape evaluating means 1002 shown in FIG. 1 is carried out using, for example, the existing corresponding SEM 200 lying within the production line. Feature index of a three-dimensional pattern shape evaluated within the SEM 200 are transmitted to the QC data collection/analysis system 501 via the network. The QC data collection/analysis system 501 estimates a device property from the feature index of the three-dimensional pattern shape to thereby detect an anormality of a pattern forming process from a tolerance level for the three-dimensional pattern shape on the basis of the result of its estimation.

Thus, since the devices such as the SEMs 200 and the respective systems are connected to the manufacturing devices on the network, warning can be quickly notified to the line manager upon the occurrence of an anormality in the pattern forming process. If relevant manufacturing apparatuses or devices are registered, then a work start can automatically be stopped, and hence a defect build-up can be prevented.

Incidentally, in the present embodiment, the SEM 200 evaluates the feature index of each pattern shape, and the QC data collection/analysis system 501 estimates the device property from the feature index of the pattern shape. However, the operation of the semiconductor device pattern evaluating system may be performed on the SEM 200. In such a case, the estimated device property is transmitted to the anormality monitoring system 502 where an anormality may be monitored.

According to the present invention, as described above, a feature index calculating means quantifies the property of a three-dimensional pattern shape to be evaluated, as feature index. A database records therein a relationship between feature index of each three-dimensional pattern shape and a device property of a circuit containing each pattern having the feature index. A device property estimating means estimates the property of each device circuit formed by a pattern to be evaluated, on the basis of the feature index of each pattern sold shape to be evaluated, which have been quantified by the feature index calculating means, and the information recorded in the database. It is therefore possible to quantitatively evaluate abnormalities of each three-dimensional shape, which have been missed upon the conventional dimension measurement and to quantitatively evaluate a relationship between device properties and three-dimensional pattern shape feature index.

Therefore, process control for implementing desired performance can be reliably carried out, and a defect build-up can be prevented from occurring. Furthermore, it is possible to provide control on a stable and high-accuracy process.

Further, a device property distribution acquirable by a wafer to be evaluated immediately after the formation of a transistor can be recognized without waiting for a final estimations, so that a production adjustment is enabled.

The invention may be embodied in other specific forms without departing from the spirit or essential properties thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

The invention claimed is:

1. A system for evaluating a pattern of a semiconductor device to be fabricated, comprising:

feature index calculating means for quantifying a property of a three-dimensional shape of each pattern to be evaluated of the semiconductor device, as a feature index;

database storing means for storing a database that records therein a relationship between feature indices of each three-dimensional pattern shape of a first semiconductor device to be fabricated and device properties of a fabricated first semiconductor device containing patterns each having the feature index; and device property estimating means for estimating properties of another semiconductor device to be fabricated formed by the pattern to be evaluated, on the basis of the feature indices of the three-dimensional pattern shape, which have been quantified by said feature index calculating means, and the information recorded in the database stored in said database storing means.

2. The system according to claim 1, wherein said device property estimating means evaluates the degree of similarity between the feature indices of the three-dimensional shape of the pattern, which have been quantified by said a feature index calculating means, and the feature indices of each three-dimensional pattern shape, which have been recorded in the database, and estimates device properties of a circuit containing patterns each having a feature index high in the degree of similarity, as the properties of another semiconductor device to be fabricated formed by the pattern to be evaluated.

3. The system according to claim 1, wherein said device property estimating means estimates the three-dimensional pattern shape, based on the feature indices of the three-dimensional pattern shape, which have been calculated by said feature index calculating means, and estimates the properties of another semiconductor device to be fabricated formed by the pattern to be evaluated, based on feature indices of a three-dimensional shape at an arbitrary specific point, of the estimated three-dimensional pattern shape.

4. The system according to claim 1, wherein said device property estimating means represents a relationship between the feature indices of each three-dimensional pattern shape, which have been recorded in the database, and the device properties of a circuit containing patterns each having the feature index in the form of a function by a regression analysis, and estimates the properties of another semiconductor device to be fabricated formed by the pattern to be evaluated, on the basis of the function and the feature indices of the three-dimensional pattern shape, which have been quantified by said feature index calculating means.

5. The system according to claim 1, wherein said device index estimating means represents a relationship between the feature indices of each three-dimensional pattern shape, which have been recorded in the database, and the device properties of a circuit containing patterns each having the feature index by information about the strength of a relationship of the respective device property with respective three-dimensional pattern shape feature index determined by a regression analysis, and estimates the properties of another semiconductor device to be fabricated formed by the pattern to be evaluated, on the basis of the information and the feature indices of the three-dimensional pattern shape, which have been quantified by said feature index calculating means.

6. A system for evaluating a pattern of a semiconductor device to be fabricated, comprising:
  feature index calculating means including,
    electron beam irradiating means for irradiating a converged electron beam onto a pattern to be evaluated, while scanning the same;
    secondary electron detecting means for detecting secondary electrons produced from the pattern by the irradiation of the electron beam by said electron beam irradiating means; and
    signal arithmetic processing means for dividing a signal waveform of the secondary electrons detected by said secondary electron detecting means into a plurality of regions, based on an amount of change in signal amount, and quantifying a property of a three-dimensional shape of the pattern to be evaluated, as a feature index on the basis of the size of said each divided region;
  database storing means for storing a database that records therein a relationship between feature indices of each three-dimensional pattern shape of a first semiconductor device to be fabricated and device properties of a fabricated first semiconductor device containing patterns each having the feature index; and
  device property estimating means for estimating a property of another semiconductor device to be fabricated formed by the pattern to be evaluated, on the basis of the feature indices of the three-dimensional pattern shape quantified by said feature index calculating means, and the information recorded in the database.

7. The system according to claim 6, wherein said secondary electron detecting means detects a plurality of secondary electrons different in angle formed by the electron beam irradiated from said electron beam irradiating means and the surface of the pattern to be evaluated.

8. The system according to claim 6, further including back scattered electron detecting means for detecting back scattered electrons produced from the pattern by the irradiation of the electron beam by said electron beam irradiating means, wherein said signal arithmetic processing means quantifies a property of the three-dimensional shape of the pattern as a feature index on the basis of a signal of the secondary electrons detected by said secondary electron detecting means, and a signal of the back scattered electrons detected by said back scattered electron detecting means.

9. A method for evaluating a pattern of a semiconductor device to be fabricated, comprising the following steps of:
  quantifying a property of a three-dimensional shape of a pattern to be evaluated of the semiconductor device, as a feature index;
  recording a relationship between said quantified feature indices of three-dimensional pattern shape, and device properties of a circuit including patterns each having the feature index, and storing the result of recording as a database; and
  estimating properties of another semiconductor device to be fabricated formed by the pattern to be evaluated, on the basis of said quantified feature indices of three-dimensional pattern shape and information recorded in the stored database.

10. A method for evaluating a pattern of a semiconductor device to be fabricated, comprising the following steps of:
  irradiating a converged electron beam onto a pattern to be evaluated, while scanning the same;
  detecting secondary electrons produced from said pattern by the irradiation of the electron beam;
  dividing a signal waveform obtained by the detection of the secondary electrons into a plurality of regions, based on an amount of change in signal amount of the signal waveform;
  quantifying properties of a three-dimensional shape of the pattern to be evaluated, as a feature index on the basis of the size of said each divided region; and
  estimating properties of another semiconductor device to be fabricated formed by the evaluated pattern from said quantified feature indices of pattern to be evaluated, on the basis of a relationship between pre-stored feature indices of each three-dimensional pattern shape and device properties of a circuit containing patterns each having the feature index.

11. The method according to claim 10, wherein in said irradiating step, the electron beam is irradiated onto the evaluated pattern from different plural directions.

12. The method according to claim 10, wherein in a step for, in said detecting step, further detecting back scattered electrons generated from the pattern to be evaluated and dividing the same into the plurality of regions, a waveform division is done based on an amount of change in signal amount of the signal waveform obtained by detecting the secondary electrons, and an amount of change in signal amount of a signal waveform obtained by detecting the back scattered electrons, and in said quantifying step, the properties of the three-dimensional pattern shape is quantified as a feature index on the basis of a signal obtained by detecting the secondary electrons, and a signal obtained by detecting the back scattered electrons.

13. The method according to claim 10, wherein in said device-circuit property estimating step, the degree of similarity between the feature indices of the three-dimensional pattern shape, which have been quantified in said quantifying step, and the pre-stored feature indices of each three-dimensional pattern shape is evaluated to thereby estimate device properties of a circuit containing a pattern having a feature index high in the degree of similarity as the property of the device circuit formed by the pattern to be evaluated.

14. The method according to claim 10, wherein in said device-circuit property estimating step, the three-dimensional shape of the pattern to be evaluated is estimated based on the feature indices of the three-dimensional pattern shape, which have been quantified in said quantifying step, and the properties of a device circuit formed by the pattern to be evaluated is estimated based on feature indices of a three-dimensional pattern shape at an arbitrary specific point, of the estimated three-dimensional pattern shape.

15. The method according to claim 10, wherein in said device circuit property estimating step, a relationship between the pre-stored feature indices of each three-dimensional pattern shape and device properties of a circuit containing patterns each having the feature index is represented in the form of a function by a regression analysis, and the property of another semiconductor device to be fabricated formed by the pattern to be evaluated is estimated on the basis of the function and the feature indices of the three-dimensional pattern shape, which have been quantified in said quantifying step.

16. The method according to claim 10, wherein in said device circuit property estimating step, a relationship between the pre-stored feature indices of each three-dimen sional pattern shape and device properties of a circuit containing patterns each having the feature index is represented by information about the strength of a relationship of the respective device properties with respective three-dimensional pattern shape feature indices determined by a regression analysis, and the properties of another semiconductor device to be fabricated formed by the pattern to be evaluated is estimated on the basis of the information and the quantified feature indices of the three-dimensional pattern shape.

* * * * *